(12) United States Patent
Avital et al.

(10) Patent No.: US 7,876,509 B2
(45) Date of Patent: Jan. 25, 2011

(54) PLATFORM TRANSPORT SYSTEMS

(76) Inventors: Alon Avital, 13 Wizo Street, Haifa (IL) 34400; Hovav Elhayani, 12 Hapamonim Street, Yokneam (IL) 20692; Gal Peled, Kibbutz Ein Hachoresh, Kibbutz Ein Hachoresh (IL) 38980; Nir Karasikov, 49 Hague St., Haifa (IL) 34980; Ze'ev Ganor, 14 Ben Shalom Street, Herzelia (IL) 46408

( * ) Notice: Subject to any disclaimer, the term of this patent is extended or adjusted under 35 U.S.C. 154(b) by 373 days.

(21) Appl. No.: 11/664,022

(22) PCT Filed: Sep. 29, 2005

(86) PCT No.: PCT/IL2005/001055

§ 371 (c)(1),
(2), (4) Date: Mar. 12, 2008

(87) PCT Pub. No.: WO2006/035447

PCT Pub. Date: Apr. 6, 2006

(65) Prior Publication Data

US 2008/0259466 A1    Oct. 23, 2008

(30) Foreign Application Priority Data

Sep. 29, 2004 (JP) .............................. 2004-283060
Sep. 29, 2004 (JP) .............................. 2004-283061
Sep. 29, 2004 (JP) .............................. 2004-283193
Mar. 30, 2005 (GB) ................................ 0506358.1

(51) Int. Cl.
    *G02B 15/14* (2006.01)

(52) U.S. Cl. ....................................... 359/696; 359/694
(58) Field of Classification Search .......... 359/694–824
    See application file for complete search history.

(56) References Cited

U.S. PATENT DOCUMENTS

| 2,886,717 | A |   | 5/1959 | Williamson et al. .......... 356/619 |
| 4,736,131 | A |   | 4/1988 | Fujimoto et al. ............. 310/323 |
| 4,836,681 | A |   | 6/1989 | Van Saders et al. ......... 356/619 |
| 4,911,533 | A | * | 3/1990 | Suzuki et al. ............... 359/824 |

(Continued)

FOREIGN PATENT DOCUMENTS

DE            4410248          7/1995

(Continued)

OTHER PUBLICATIONS

International Search Report PCT/IL2005/001037, Jan. 27, 2006.

(Continued)

*Primary Examiner*—Mohammed Hasan

(57) ABSTRACT

A transport system for moving and positioning an object comprising: a tube (24) having an axis of rotation and formed with threads (36) on at least a portion of its surface; at least one platform (126) to which the object (116) is mountable having threads that mesh with the threads of the tube; at least one linear guide (130) along which the at least one platform moves freely that prevents rotation of the at least one platform when the tube rotates about its axis of rotation; and a piezoelectric motor controllable to rotate the tube and thereby selectively translate the at least one platform in either direction along the tube's axis of rotation.

30 Claims, 25 Drawing Sheets

U.S. PATENT DOCUMENTS

| | | | |
|---|---|---|---|
| 5,180,941 A | 1/1993 | Seki et al. | 310/323 |
| 5,270,868 A | 12/1993 | Nomura et al. | 359/700 |
| 5,335,115 A * | 8/1994 | Kawai et al. | 359/696 |
| 5,616,980 A | 4/1997 | Zumeris | 310/323 |
| 5,689,375 A | 11/1997 | Satoh et al. | 359/699 |
| 5,983,032 A * | 11/1999 | Miyamoto | 396/83 |
| 6,339,508 B1 * | 1/2002 | Nozawa et al. | 359/686 |
| 6,392,328 B1 | 5/2002 | Ashizawa | 310/323.01 |
| 6,914,729 B2 * | 7/2005 | Mikami | 359/696 |
| 2002/0077069 A1 | 6/2002 | Heurtaux | 455/90 |
| 2003/0006675 A1 | 1/2003 | Bartzke et al. | 310/328 |
| 2003/0052573 A1 | 3/2003 | Wischnewskiy | 310/322 |
| 2004/0090146 A1 | 5/2004 | Miyazawa | 310/328 |
| 2008/0211348 A1 | 9/2008 | Wischnewskij et al. | 310/323.02 |

FOREIGN PATENT DOCUMENTS

| | | |
|---|---|---|
| EP | 0359875 | 3/1990 |
| EP | 0464764 | 1/1992 |
| EP | 0836266 | 4/1998 |
| EP | 1357726 | 10/2003 |
| ES | 2154574 | 4/2001 |
| JP | 04 212913 | 8/1992 |
| JP | 10 023771 | 1/1998 |
| JP | 04 159425 | 6/2004 |
| JP | 05 130637 | 5/2005 |
| WO | WO 01/33645 | 5/2001 |
| WO | WO 2004/012279 | 2/2004 |
| WO | WO 2004/030196 | 4/2004 |

OTHER PUBLICATIONS

International Search Report PCT/IL2005/001055, Mar. 24, 2006.

* cited by examiner

PLATFORM TRANSPORT SYSTEMS

RELATED APPLICATIONS

The present application is a US National Phase of PCT Application No. PCT/IL2005/001055, filed on Sep. 29, 2005, which claims the benefit under 35 U.S.C. 119(a) of Japanese Patent Application No. P2004-283060 filed on Sep. 29, 2004, Japanese Patent Application No. P2004-283061 filed on Sep. 29, 2004, Japanese Patent Application No P2004-283193 filed on Sep. 29, 2004 and British Patent Application No. 0506.358.1 filed on Mar. 30, 2005, the disclosures of which are incorporated herein by reference.

FIELD OF THE INVENTION

The invention relates to transport systems that comprise a platform to which an object may be mounted and which can be controlled to accurately transport and position the platform and thereby the object.

BACKGROUND OF THE INVENTION

Many applications require devices for accurately and rapidly controlling motion and positioning of a component, which may be relatively small and often delicate, of a mechanical, opto-mechanical and/or electromechanical system. For example, optical systems for use with cameras incorporated in cell phones often require transport systems for accurately moving and controlling the position of lenses and/or other components of the optical systems to provide various focusing and zooming functions. As cell phones become smaller and room available for these cameras shrinks, constraints on the size of transport systems for controlling position of the lenses and/or components, and accuracy and speed with which the transport systems perform, in general become more stringent.

Various piezoelectric motors are controllable to provide accurately controlled amounts of kinetic energy to mechanical systems. For example, U.S. Pat. No. 5,616,980 to Zumeris et al, and PCT Publication WO 00/74153 entitled "Multilayer Piezoelectric Motor" describe piezoelectric motors that are capable of transmitting accurately controlled amounts of kinetic energy to move and position objects. Piezoelectric motors described in the referenced patent and PCT Publication comprise a relatively thin rectangular piezoelectric vibrator having large parallel face surfaces and narrow short and long edge surfaces. Optionally, a surface region of a short edge of the vibrator or a surface of a "friction nub" on a short edge of the vibrator functions as a motor coupling surface that is pressed to a contact surface of a moveable body. Electrodes on the face surfaces of the vibrator or, for piezoelectric motors described in WO 00/74153, on face surfaces of layers of the vibrator, are electrified to excite vibrations in the motor's friction nub that transmit kinetic energy to the moveable body via the body's contact surface. PCT Publication PCT/IL00/00698 entitled "Piezoelectric Motors and Motor Driving Configurations" describes various piezoelectric motors and methods of coupling such motors to rotate moveable bodies. PCT Application PCT/IL03/00603 entitled "High Resolution Piezoelectric Motor" describes piezoelectric motors and methods of operating piezoelectric motors to position an object with relatively high accuracy. The disclosures of all the above referenced documents are incorporated herein by reference.

SUMMARY OF THE INVENTION

An aspect of some embodiments of the present invention relates to providing transport systems comprising a platform, hereafter a "carrier platform", to which an object may be mounted and a transmission system that couples a motor to the platform so that the motor is controllable to accurately move and position the platform.

According to an aspect of some embodiments of the invention, the transmission system is configured to couple a piezoelectric motor to the platform.

An aspect of some embodiments of the invention, relates to providing a transport system, hereinafter a "turret-drive system", comprising a carrier platform and a transmission comprising a tube, hereafter a "drive-tube", rotatable about its axis that is coupled to the platform.

The carrier platform is formed with threads that mesh with threads on a circularly cylindrical surface of the drive-tube and is coupled to at least one linear guide rail along which the platform is able to freely slide or roll. The at least one guide rail prevents the carrier platform from rotating when the drive-tube rotates. As a result, if the drive-tube is rotated the carrier platform translates along the axis of the drive-tube. An optionally piezoelectric motor is coupled to the drive-tube and is controllable to rotate the drive-tube and thereby control displacement of the carrier platform and the component mounted thereto along the axis of the drive-tube.

An aspect of some embodiments of the invention relates to providing a transport system, hereinafter referred to as a "shinny-drive system" comprising a carrier platform and a transmission system comprising at least one drive rail to which the carrier platform is mounted.

In accordance with an embodiment of the invention, at least one piezoelectric motor is mounted to the carrier platform so that a coupling surface of the motor presses resiliently against a drive rail of the at least one drive rail. The motor is controllable to generate vibrations in its coupling surface that cause the motor, and thereby the platform, to "shinny" and translate along the drive rail. Optionally, the at least one drive rail comprises a plurality of drive rails and the at least one motor comprises a plurality of motors. Optionally each motor is resiliently pressed toward a different one of the plurality of drive rails so that the motor's coupling surface presses against the drive rail. Optionally, the transmission system comprises at least one guide rail along which the carrier platform is configured to freely slide or roll. The guide rail contributes to stabilizing orientation of the platform and providing it with accurately controlled motion and positioning. Optionally, the at least one motor is mounted to the platform and pressed towards a drive rail so that it generates a torque that contributes to registering and aligning the platform to the at least one drive rail and/or guide rail.

An aspect of some embodiments of the present invention relates to providing a transport system, hereinafter referred to a "worm-drive system", comprising a rod, hereinafter a "worm-drive shaft", formed with threads that mesh with corresponding threads formed in a carrier platform. An optionally piezoelectric motor is coupled to the worm-drive shaft and controllable to rotate it in order to translate the platform along the worm-drive shaft.

An aspect of some embodiments of the present invention relates to providing a transport system, hereinafter referred to as a "deformation-drive system", in which a carrier platform is coupled to at least one deformable component, hereinafter referred to as a "deformable coupler". Optionally, a piezoelectric motor is controlled to selectively deform or relax deformation of the at least one deformable coupler to move and control the position of the carrier platform.

An aspect of an embodiment of the invention, relates to providing a moiré encoder comprising a moiré pattern generated by first and second periodic patterns for determining position and/or motion of a carrier platform. The encoder in accordance with an embodiment of the invention comprises at least first and second photodetectors that provided optionally quadrature signals, is relatively easy to produce and is less sensitive to disturbances in relative orientation of the first and second periodic patterns than are conventional moiré encoders.

In an embodiment of the invention, at least one of the first and second periodic patterns used to from the moiré pattern is formed with a region that is shifted by, optionally, a quarter of period relative to another portion of the periodic pattern. As a result, the moiré pattern comprises first region of fringes spatially phase shifted by 90° relative to a second region of fringes in the moiré pattern. The first and second photodetectors are positioned to sense fringes in the first and second regions respectively and provide therefore quadrature signals useable to determine direction of motion of the first and second periodic patterns relative to each other.

By forming at least one of the first and second periodic patterns with a phase shifted region, accuracy constraints on positioning of the first and second photodetectors may be relaxed relative to accuracy constraints on positioning of quadrature detectors in prior art moiré encoders. In addition, the encoder in accordance with an embodiment of the invention is less sensitive to perturbation in the relative orientation of the first and second periodic patterns.

An aspect of some embodiments of the invention relates to providing an optical system comprising a transport system, in accordance with an embodiment of the invention, for moving and positioning at least one component of the optical system. Optionally, the component is a lens or group of lenses (hereinafter it is understood that a lens as used herein refers to a single lens and/or a system of lenses) comprised in the optical system. Optionally, the optical system is comprised in a camera. Optionally, the camera is incorporated into a cellular phone.

There is therefore provided in accordance with an embodiment of the invention, a transport system for moving and positioning an object comprising: a tube having an axis of rotation and formed with threads on at least a portion of its surface; at least one platform to which the object is mountable having threads that mesh with the threads of the tube; at least one linear guide along which the at least one platform moves freely that prevents rotation of the at least one platform when the tube rotates about its axis of rotation; and a piezoelectric motor controllable to rotate the tube and thereby selectively translate the at least one platform in either direction along the tube's axis of rotation.

Optionally, the tube threads comprise threads on at least a region of the surface of the lumen of the tube. Optionally, the at least one platform comprises a platform having threads that mesh with the threads on the surface of the lumen.

In an embodiment of the invention, the tube threads comprise threads on at least a region of the external surface of the tube. Optionally, the at least one platform comprises a platform having threads that mesh with the threads on the external surface.

In an embodiment of the invention the transport system and comprising at least one other platform that does not comprise threads that mesh with the threads of the tube. Optionally, the transport system comprises a latch operable to secure the other platform at least one predetermined position along the axis of the tube. Optionally, the latch comprises at least one elastic catch and at least one matching notch formed in a surface of transport system that cooperate to secure the other platform at the at least one predetermined position. Optionally, the other platform comprises a catch of the at least one elastic catch. Alternatively or additionally a notch of the at least one notch is formed in the other platform.

In an embodiment of the invention, the at least one linear guide comprises an elastic catch of the at least one catch. In an embodiment of the invention, a notch of the at least one notch is formed in the at least one linear guide.

In an embodiment of the invention, the at least one predetermined position comprises a plurality of positions. Optionally, motion of a platform of the at least one platform having threads that mesh with threads of the tube moves the other platform between different positions of the predetermined positions.

In some embodiments of the invention, the piezoelectric motor comprises a coupling surface that is pressed to a contact surface region of the tube and the motor is controlled to generate motion in the coupling surface that rotates the tube. Optionally, the tube comprises an annular collar concentric with the axis of the tube and the surface region to which the coupling surface of the motor is pressed is a surface region of the collar.

Optionally, the coupling surface of the piezoelectric motor comprises a friction nub. Additionally or alternatively, the piezoelectric motor comprises an annular piezoelectric body having two relative large parallel annular surfaces wherein the motor coupling surface comprises at least a portion of one of the annular surface regions and traveling waves excited in the annular piezoelectric body rotate the tube.

There is further provided in accordance with an embodiment of the invention, a transport system for moving and positioning an object comprising: at least one platform to which the object is mountable; at least one piezoelectric motor mounted to each of the at least one platform having a coupling surface for transmitting kinetic energy from the motor to a moveable body; at least one drive rail; a resilient body that presses the coupling surface to contact a drive rail of the at least one drive rail; and at least one guide rail parallel to the drive rail along which the platform moves substantially freely that prevents the platform from rotating relative to the drive rail; wherein the piezoelectric motor is controllable to apply force to the drive rail to selectively translate the platform in either direction along the drive rail.

Optionally, the at least one drive rail comprises a plurality of parallel drive rails. Optionally, a platform of the at least one platform has a different piezoelectric motor mounted thereto for each of the drive rails. Optionally, forces generated by the resilient body between the coupling surface of each motor and the drive rail to which it is pressed generate torque that urges the platform to the guide rail. Optionally, the resilient body is formed as an integral part of the platform. Optionally, the part of the platform is connected to the rest of the platform by a relatively thin resilient neck. Optionally, the part and the neck are defined by a slot formed in the platform.

In some embodiments of the invention, the platform comprises at least one bearing having a component that rolls along the at least one guide rail. Optionally, the rolling component and the guide rail have corresponding complementary surfaces that substantially prevent the guide rail and rolling component from displacing laterally with respect to the guide rail.

Optionally, one of the complementary surfaces is a convex surface and the other a concave surface. Additionally or alternatively, the rolling component comprises a wheel. Optionally, the wheel is formed with a groove that matches the shape of complementary surface of the guide rail.

There is further provided in accordance with an embodiment of the invention, transport system for positioning an object comprising: at least one platform formed with at least one threaded hole to which the object is mountable; at least one shaft formed with threads that mesh with the threads in a threaded hole of the at least one threaded hole; a contact surface coupled to each of the at least one shaft so that when the contact surface rotates, the shaft rotates; at least one linear guide parallel to the shaft along which the platform moves substantially freely that prevents the platform from rotating relative to the shaft; a piezoelectric motor controllable to rotate the contact surface and thereby the shaft to selectively translate the platform in either direction along the shaft.

Optionally, the at least one shaft comprises a plurality of threaded shafts. Optionally, the at least one platform comprises a plurality of platforms. Optionally, threads of at least two of the plurality of shafts mesh with threads in holes only of different carrier platforms. Optionally, threads of each shaft mesh with threads in a threaded hole in only one platform.

In some embodiments of the invention, the contact surface is a planar surface having a normal parallel to the axis of the shaft. In some embodiments of the invention, wherein the contact surface is a circularly cylindrical surface having an axis of rotation coincident with the axis of the drive shaft.

There is further provided in accordance with an embodiment of the invention, a transport system for positioning an object comprising: at least one platform formed with at least two threaded holes to which the object is mountable; at least two parallel shafts formed with threads that mesh with the threads in a threaded hole of the at least two threaded holes; a contact surface coupled to each of the at least two shafts so that when the contact surface rotates, the shaft rotates; and a piezoelectric motor controllable to rotate the contact surface of each shaft and thereby the shaft to selectively translate the platform in either direction along the shaft.

There is further provided in accordance with an embodiment of the invention, a transport system for positioning an object comprising: at least one platform to which the object is mountable; at least one support structure having a deformable shape coupled to the platform; and at least one piezoelectric motor operable to deform the at least one support structure; wherein the at lest one piezoelectric motor deforms the shape of the support structure from a first shape to a second shape to move the platform from a first position to a second position.

Optionally, the support structure has the shape of a parallelogram. Optionally, the piezoelectric motor changes the height of the parallelogram to change the shape of the support structure.

In some embodiments of the invention, the system with the exception of the at least one piezoelectric motor is formed as a single integral piece.

There is further provided in accordance with an embodiment of the invention, an optical system comprising: a transport system according to any of the preceding claims; at least one optical component mounted to a platform of the transport system; and a controller that controls the transport system to move and position the platform and thereby the optical component. Optionally, the optical component comprises a lens. Optionally, the lens is a component of a zoom lens system.

There is further provided in accordance with an embodiment of the invention, a camera comprising an optical system in accordance with an embodiment of the invention.

There is further provided in accordance with an embodiment of the invention, a cellular phone comprising a camera in accordance with an embodiment of the invention.

There is further provided in accordance with an embodiment of the invention, a moiré encoder for monitoring position of a moveable object, the encoder comprising: a first periodic pattern having first and second periodic pattern regions wherein the first periodic pattern region is phase shifted with respect to the second periodic pattern; a second periodic pattern that interferes with the first and second pattern regions to generate a moiré pattern having respectively first and second regions of fringes; first and second photodetectors that generate signals responsive respectively to the fringes in the first and second regions of the moiré pattern; wherein one of the first and second periodic patterns is stationary with respect to the moveable object. Optionally, the first and second pattern regions have same periods. Optionally, the second periodic pattern has a same period as the period of the first and second pattern regions.

In some embodiments of the invention, the first and second pattern regions of are shifted by a quarter period relative to each other.

In some embodiments of the invention, the directions along which the first and second regions are periodic are parallel. Optionally, the first and second pattern regions are displaced relative to each other along a direction perpendicular to a direction along which the patterns are periodic. Optionally, the first and second pattern regions are displaced relative to each other along a direction parallel to the direction along which the patterns are periodic.

In some embodiments of the invention, the first pattern region comprises a grid of equidistant parallel lines. In some embodiments of the invention, the second periodic region comprises a second grid of equidistant parallel lines. In some embodiments of the invention, the second periodic pattern comprises a second grid of equidistant parallel lines.

BRIEF DESCRIPTION OF FIGURES

Non-limiting examples of embodiments of the present invention are described below with reference to figures attached hereto. In the figures, which are listed following this paragraph, identical structures, elements or parts that appear in more than one figure are generally labeled with a same numeral in all the figures in which they appear. Dimensions of components and features shown in the figures are chosen for convenience and clarity of presentation and are not necessarily shown to scale.

DETAILED DESCRIPTION OF EXEMPLARY EMBODIMENTS

Figure 1A:
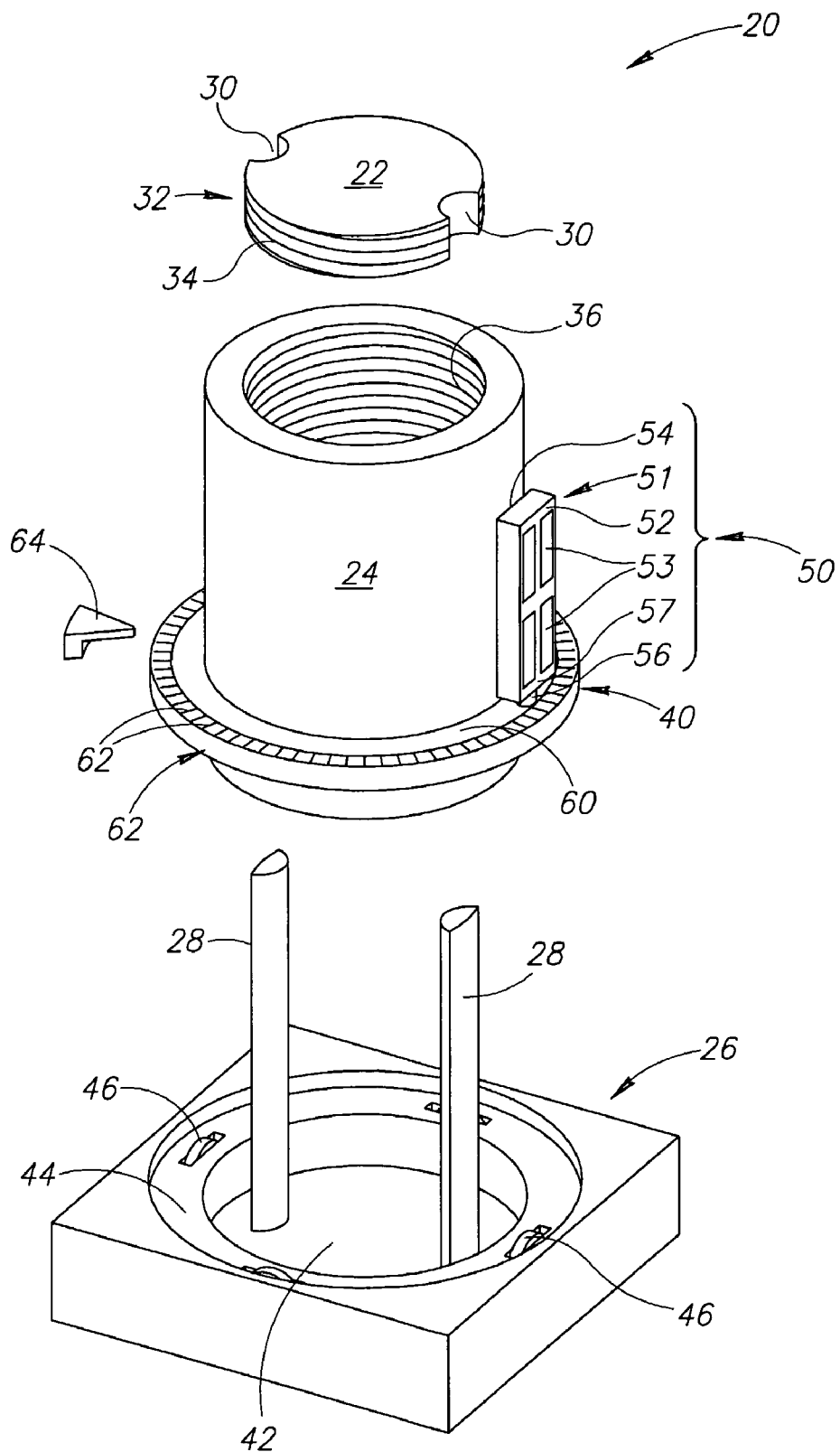
FIGS. 1A and 1B schematically show an exploded view of a turret-drive system and a view of the assembled system respectively, in accordance with an embodiment of the present invention.
Figure 1B:
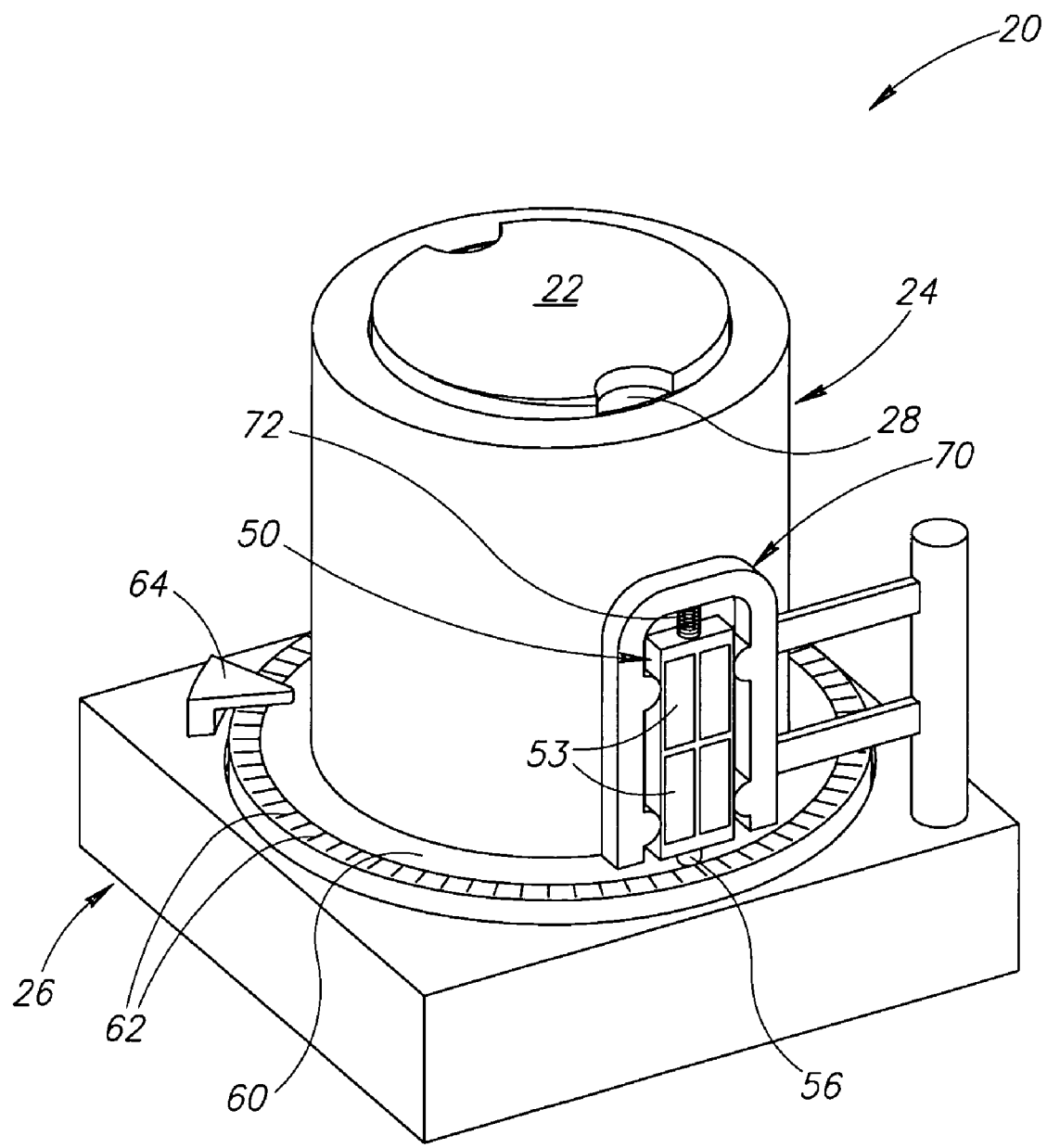

FIGS. 1A and 1B schematically show an exploded view of a turret-drive system 20 and a view of the assembled system respectively, in accordance with an embodiment of the present invention.

Turret-drive transport system 20 optionally comprises a carrier platform 22 to which an object to be moved by the transport system is attached, a drive-tube 24 a base 26 and at least one guide rail 28.

Carrier platform 22 is formed with a matching through hole or slot 30 for each guide rail 28 and has a surface 32 at least a portion of which is circularly cylindrical and has formed thereon threads 34. Drive-tube 24 has formed, optionally on it's inside surface, threads 36 that match threads 34 so that carrier platform 22 may be screwed into the drive-tube. Optionally, drive-tube 24 comprises a drive collar 40. Base 26 is optionally formed with a circular well 42 and an annular recess 44 concentric with the well in which optionally four roller bearings of any suitable configuration known in the art represented by wheels 46 are mounted. Well 42, its associated recess 44 and bearings 46 are configured so that drive-tube 24 may be seated in the well with drive collar 40 riding on the bearings so that when seated, the drive-tube is easily rotated.

To assemble turret-drive 20, carrier platform 22 is screwed into drive-tube 24 and slots 30 of the carrier platform aligned with guide rails 28. The drive-tube is then seated into well 42 by passing guide rails 28 through slots 30 until drive collar 40 contacts and "rides" on bearings 46.

At least one piezoelectric motor 50 is coupled optionally to drive collar 40. Piezoelectric motor 50 is optionally of a type described in U.S. Pat. No. 5,616,980 or PCT Publication WO 00/74153 referenced above, or variants thereof. By way of example, and for convenience of presentation, piezoelectric motor 50 in FIGS. 1A and 1B and piezoelectric motors generally shown in other figures are similar to types of piezoelectric motors shown in U.S. Pat. No. 5,616,980. Other piezoelectric motors known in the art may be substituted for the types shown.

Piezoelectric motor 50 optionally comprises a thin rectangular piezoelectric vibrator 51. A first, relatively large face surface 52 optionally comprises four quadrant electrodes 53 that are located on the face surface in a symmetric checkerboard pattern. Optionally, a single large electrode (not shown) is located on second face surface 54 opposite face surface 52. Piezoelectric motor 50 optionally comprises a friction nub 56 on short edge surface 57 of vibrator 51, preferably located at the center of the edge surface. Friction nub 56 is optionally formed from a hard wear resistant material such as Alumina, stainless steel or a wear resistant high impact plastic such as PEEK (polyethyl ethyl ketone).

Piezoelectric motor 50 is coupled to drive collar 40 by resiliently urging the motor to the collar so that friction nub 56 presses against a surface region 60 of the collar. Any of various devices and methods known in the art may be used to resiliently urge piezoelectric motor 50 to collar 40. By way of example, in FIG. 1B piezoelectric motor 50 is schematically shown mounted to a "horseshoe" frame 70 having an elastic member 72 that urges the motor towards collar 40 so that friction nub 56 presses resiliently against the collar. Optionally, each of at least one piezoelectric motor 50 is positioned so that its friction nub 56 presses against collar 40 at a location opposite that at which a bearing 46 contacts the collar. Optionally, surface region 60 along which friction nub 56 collar 40 is formed from or protected by a hard wear resistant material, optionally, a same material from which the friction nub is formed.

Electrodes 53 are electrified in accordance with any methods of operation known in the art to excite vibrations and/or motion in friction nub 46 which apply a torque to rotate collar 40 and drive-tube 24 selectively clockwise or counterclockwise. To rotate drive-tube 24 through relatively large rotation angles, electrodes 53 are optionally electrified by an AC voltage to generate elliptical vibrations in friction nub 46 or are pulsed with unipolar voltage to generate a pulsed motion of the friction nub as described in U.S. Pat. No. 5,616,980 referenced above. For rotation of drive-tube 24 through relatively small, accurately controlled rotation angles, piezoelectric motor 50 is optionally operated in a DC mode as described PCT Application PCT/IL03/00603 referenced above.

Because guide rails 28 prevent carrier platform 22 from rotating, when piezoelectric motor 50 is controlled to rotate drive-tube 24, the carrier platform translates along the length of the drive-tube. By controlling piezoelectric motor 50 to rotate drive-tube 24 selectively through an accurately controlled clockwise or counterclockwise rotation angle, carrier platform 22 can selectively be translated along either direction along the drive-tube and accurately positioned along the drive tube. For example, assume that threads 34 and matching threads 36 are left handed threads (as shown in FIG. 1A). Then when piezoelectric motor 50 is controlled to rotate drive-tube 24 clockwise as seen from the top of turret-drive 20, (i.e. the carrier platform side of the turret-drive) carrier platform 22 moves toward base 26. When the motor is controlled to rotate drive-tube 24 counterclockwise, the carrier platform moves away from the base.

Optionally, turret-drive 20 is provided with a monitoring system that monitors rotation of drive-tube 24. Any of various position monitoring sensors and systems known in the art may be used to monitor rotation angle of drive-tube 24. Optionally, the monitor system comprises fiducial markings located on drive-tube 24 and a sensor that senses the location and/or motion of the fiducial markings. By way of example, in turret-drive 20, photodetector 64 senses graduation rulings 62 provided on drive collar 40 to monitor rotation of drive-tube 24. In some embodiments of the invention, photodetector 64 is a component of a moiré encoder and graduation rulings 62 are rulings of a first grating that are used in conjunction with a second, stationary grating that filters light entering the photodetector (not shown) to form a moiré pattern of fringes. Motion of the fringes are sensed by photodetector 64 and used to monitor rotation and position of drive-tube 24 and thereby of carrier platform 22. Optionally, the moiré encoder is a conventional moiré encoder and the moiré pattern a conventional moiré pattern. Optionally, the moiré encoder is an encoder in accordance with an embodiment of the invention and the moiré pattern comprises a moiré pattern having a first region of fringes phase shifted by optionally 900 relative to fringes of a second region of the moiré pattern as described below. Optionally, the monitoring system generates signals that are used in a closed loop control system to control piezoelectric motor 50.

Whereas, a position monitoring system is discussed specifically with reference to turret drives, a position monitoring system, such as a moiré encoder, may be used with any transport system in accordance with an embodiment of the invention to determine directly or indirectly position of a component of the system and/or a carrier platform comprised in the transport system.

Turret-drive 20 may advantageously be used in any of various applications requiring translation and accurate positioning of a component by mounting the component to platform 22 and controlling at least one piezoelectric motor 50 to position the platform along drive-tube 24. By way of illustrative example, in an embodiment of the invention, turret-drive 20 is used to control position of at least one lens of a camera 100 schematically shown partially cut away in FIG. 1C.

Camera 100 comprises a turret-drive system 102 similar to that shown in FIGS. 1A and 1B and a photosensitive surface 104, such as a CCD or CMOS photosurface, mounted at the bottom of well 42 of the turret-drive system. A first objective lens or lens system represented by a lens 106 is optionally mounted to drive-tube system 24 or to a structure that maintains the lens at an accurately defined location relative to turret-drive 102 and photosurface 104. By way of example in FIG. 1C lens 106 is mounted to drive-tube 24. A second, focusing lens or lens system represented by a lens 108, is mounted to a carrier platform 22, similar to that shown in FIGS. 1A and 1B which is formed with a through hole in order to adapt the carrier to hold the lens. Piezoelectric motor 50 is controlled to rotate drive tube 24 and change the position of carrier platform 22 along the drive-tube and thereby distance of lens 108 from photosurface 104 as may be required to focus a scene imaged by camera 100 on the photosurface. Any of various methods and devices known in the art for determining for a given scene an appropriate distance at which to position focusing lens 108 in order to focus the scene on photosurface 104 may be used to control piezoelectric motor 50.

Figure 1C:
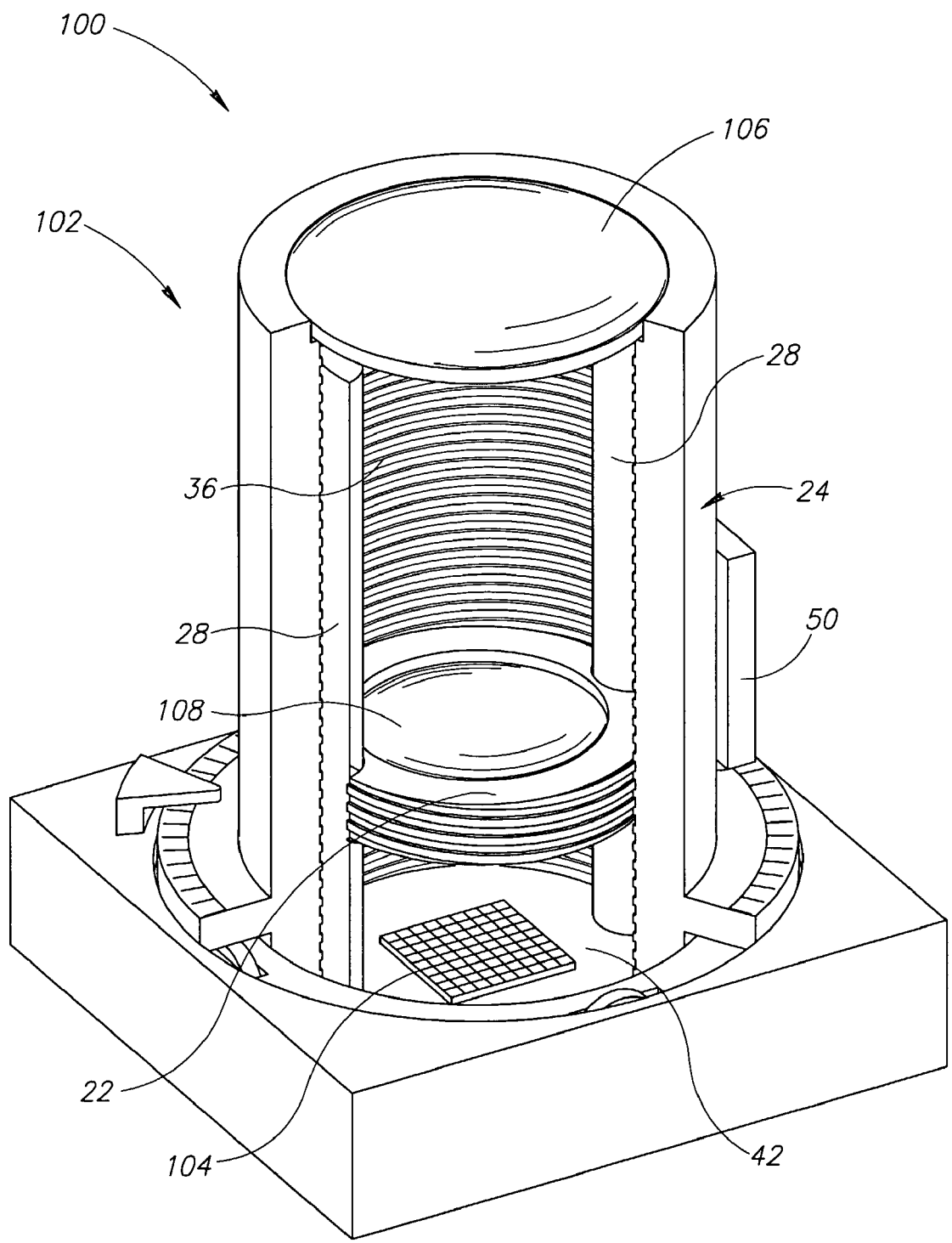
FIG. 1C schematically shows a turret-drive system similar to that shown in FIGS. 1A and 1B adapted to focus a lens in a camera, in accordance with an embodiment of the present invention.
Figure 1D:
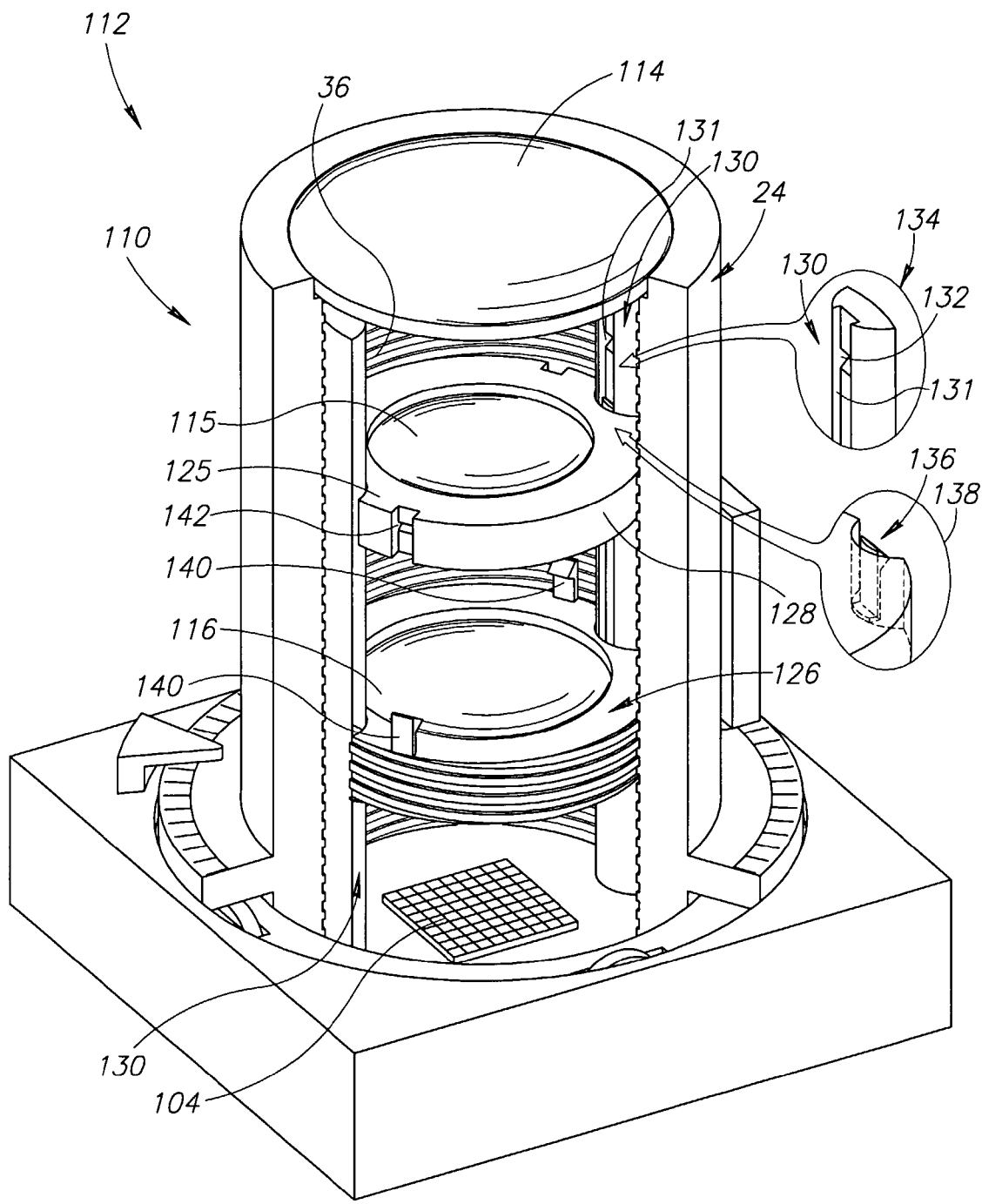
FIG. 1D schematically shows a turret-drive system similar to that shown in FIGS. 1A and 1B adapted to move and position lenses in a mechanically compensated zoom lens optical system, in accordance with an embodiment of the present invention.

By way of another example, FIG. 1D schematically shows a turret-drive system 110 similar to turret-drive system 20 used to control a mechanically compensated zoom lens system in a camera 112, in accordance with an embodiment of the invention.

Camera 112 comprises a photosurface 104 and a zoom lens system optionally comprising a "fixed" objective lens or lens system 114 mounted to drive-tube 24, and two moveable lenses, or lens systems 115 and 116. (As camera 112 is optionally configured, objective lens 114 is mounted to drive-tube 24 and rotates with the drive-tube, but is considered "fixed" because its distance from photosurface 104 is, optionally, fixed.) Moveable lens 116 is mounted to a carrier platform 126 similar to carrier platform 22 shown in FIG. 1C. Moveable lens 115 is mounted to a carrier platform 125 that optionally does not have threads that mesh with threads 36 of drive-tube 24. Platform 125 has an external surface 128 that just contacts the tops of threads 36. As a result, platform 125 is relatively accurately aligned with the rotation axis (not shown) of drive-tube 24 but rotation of the drive-tube does not cause carrier platform 125 to translate along the length of the drive-tube.

In accordance with an embodiment of the invention, carrier platform 126 is coupled to carrier platform 125 and "piggybacks" carrier platform 125 to translate and position carrier platform 125 along the length of drive-tube 24. When positioned by carrier platform 126 at a desired position, carrier platform 125 is optionally "locked" into the position by at least one elastic catch located on carrier platform 125 that engages a notch, optionally formed in a guide rail 130 comprised in turret-drive 112.

Guide rails 130 comprised in turret-drive 112 are similar to guide rails 28 shown in FIGS. 1A and 1C but, in accordance with an embodiment of the invention, at least one guide rail 130 is formed with a channel 131 having at least one "channel" notch 132 formed therein. Inset 134 shows an enlarged portion of a guide rail 130 that shows channel 131 and a notch 132 formed in the channel. Optionally, both guide rails 130 are formed with a channel 131 and the at least one "channel notch" 132, in one channel 131 is a mirror image of the at least one channel notch 132 of the other guide rail. By way of example, in turret-drive 112 each guide rail 130 is assumed to be formed with a plurality of channel notches 132.

For each channel 131, platform 125 comprises an elastic "channel catch" 136 configured to ride in the channel and snap into and engage notches 132 in the channels. A channel catch 136 of carrier platform 125 is shown in an inset 138, which shows an enlarged portion of the platform carrier. Parts of channel catch 136 that would not normally be seen in the perspective of inset 138 are shown with ghost lines. When channel catches 136 engage channel notches 132 located at given corresponding positions along channels 130, carrier platform 125 is "locked" at a given distance from photosurface 104. The "notch positions" of carrier platform 125 correspond to positions of lens 115 for which lenses 114, 115 and 116 provide desirable magnifications and satisfactory focusing of a scene imaged by camera && on photosurface 104.

Carrier platform 126 comprises, optionally, a pair of platform catches 140 configured to engage platform notches 142 formed in carrier platform 126 and couple platform 126 to platform 125. To engage catches 140 with notches 142 and lock carrier platform 125 to carrier platform 126, in accordance with an embodiment of the invention, drive-tube 24 is rotated at relatively high speed to "collide" carrier platform 126 into carrier platform 125. Inertia of carrier 125, friction and forces generated between channel catches 136 and channel notches 132 generate "collision" forces that deform carrier catches 140 so that they bend outward and slip into and engage carrier notches 142. To decouple platform 125 from platform 126, in accordance with an embodiment of the invention, drive-tube 24 is rotated at sufficiently high speed to "jerk" carrier platform 125 away from carrier platform 126. Inertia, friction and forces generated by channel catches and notches 136 and 132 generate "jerking" forces that deform carrier catches 140 so that they bend outward and slip out of and away form carrier notches 142.

Once carrier platform 126 is coupled to carrier platform 125, drive-tube 24 may be rotated, in accordance with an embodiment of the invention, sufficiently slowly so that the carrier platforms do not decouple and motion of carrier platform 126 is able to disengage carrier platform 125 from one notch position and piggy-back carrier platform 125 to another desired notch position.

Figure 1E:
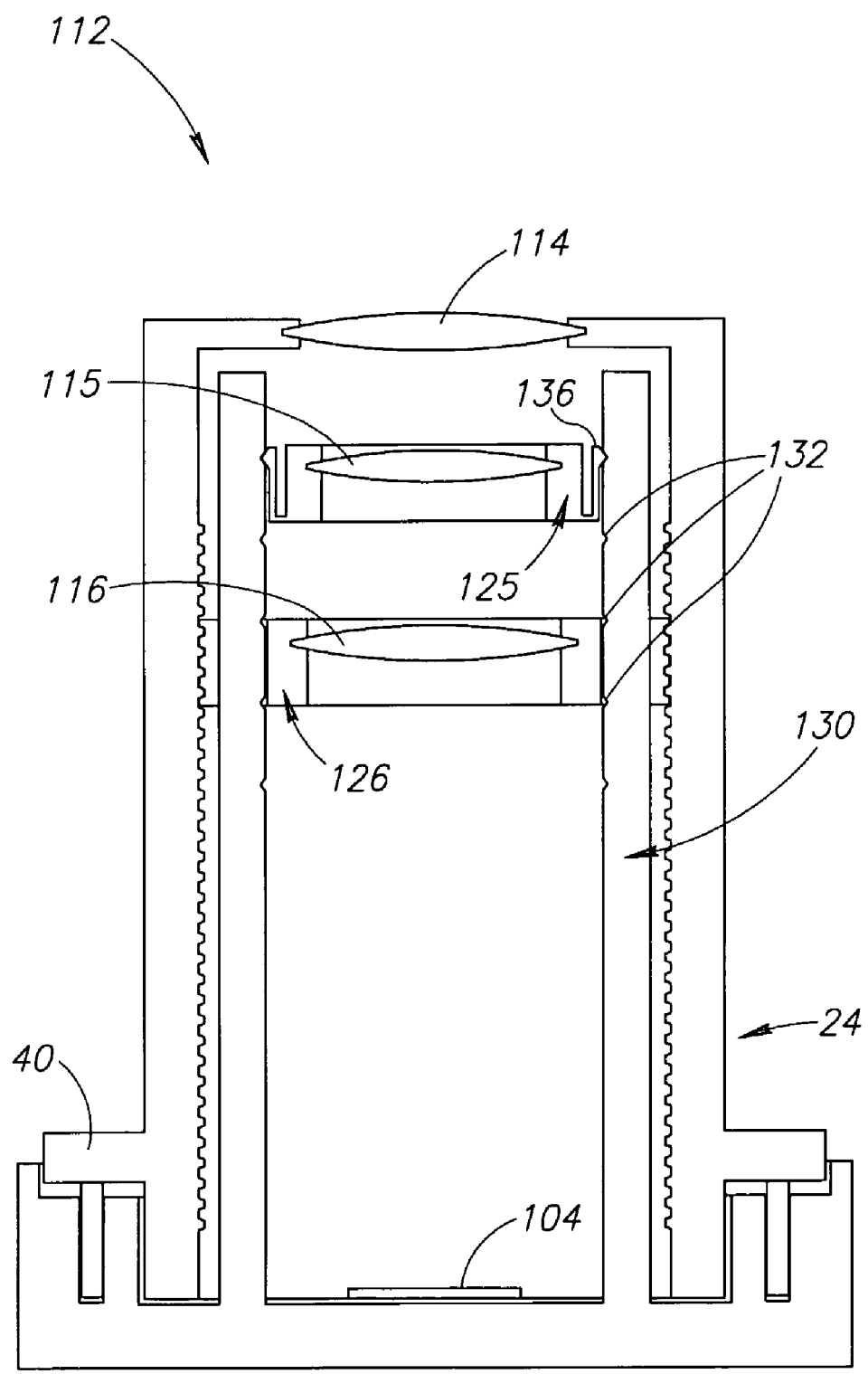
FIGS. 1E and 1F schematically show the lenses comprised in the optical system shown in FIG. 1D positioned by the turret-drive in telephoto and wide angle configurations respectively, in accordance with an embodiment of the present invention.
Figure 1F:
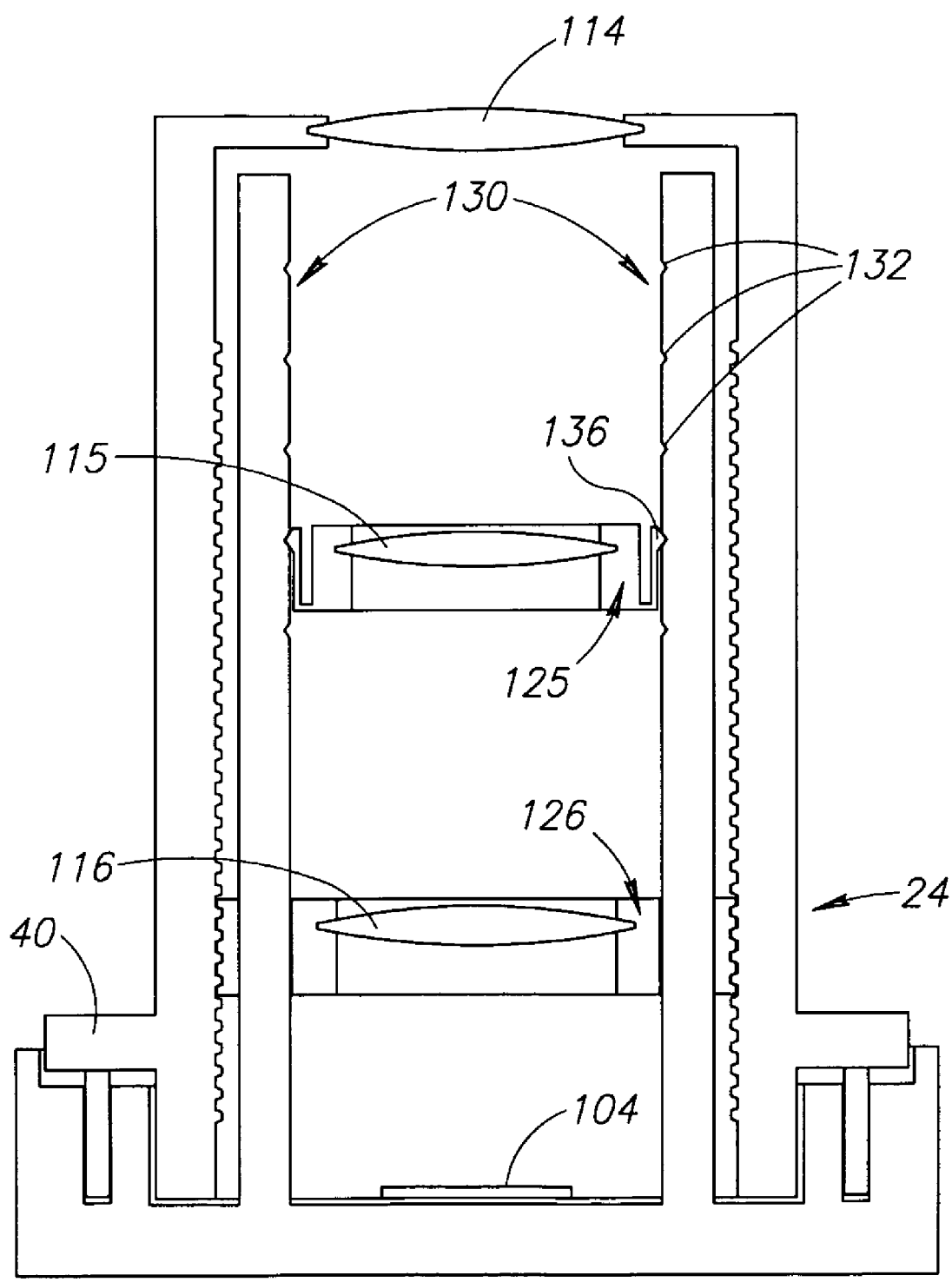

Optionally, positions of channel notches 132 provide a plurality of positions for lens 115 between a position at which lens 115 (with lens 116 at a compensating position along drive-tube 24) provides a small magnification, wide-angle field of view of a scene and a position at which lens 115 and 116 provide a large magnification, telephoto view of the scene. FIGS. 1E and 1F schematically show a cross section view of camera 112 shown in FIG. 1D that show carrier platform 125 and lens 115 at wide angle and telephoto notch positions respectively and lens 126 at corresponding compensating positions.

Figure 1G:
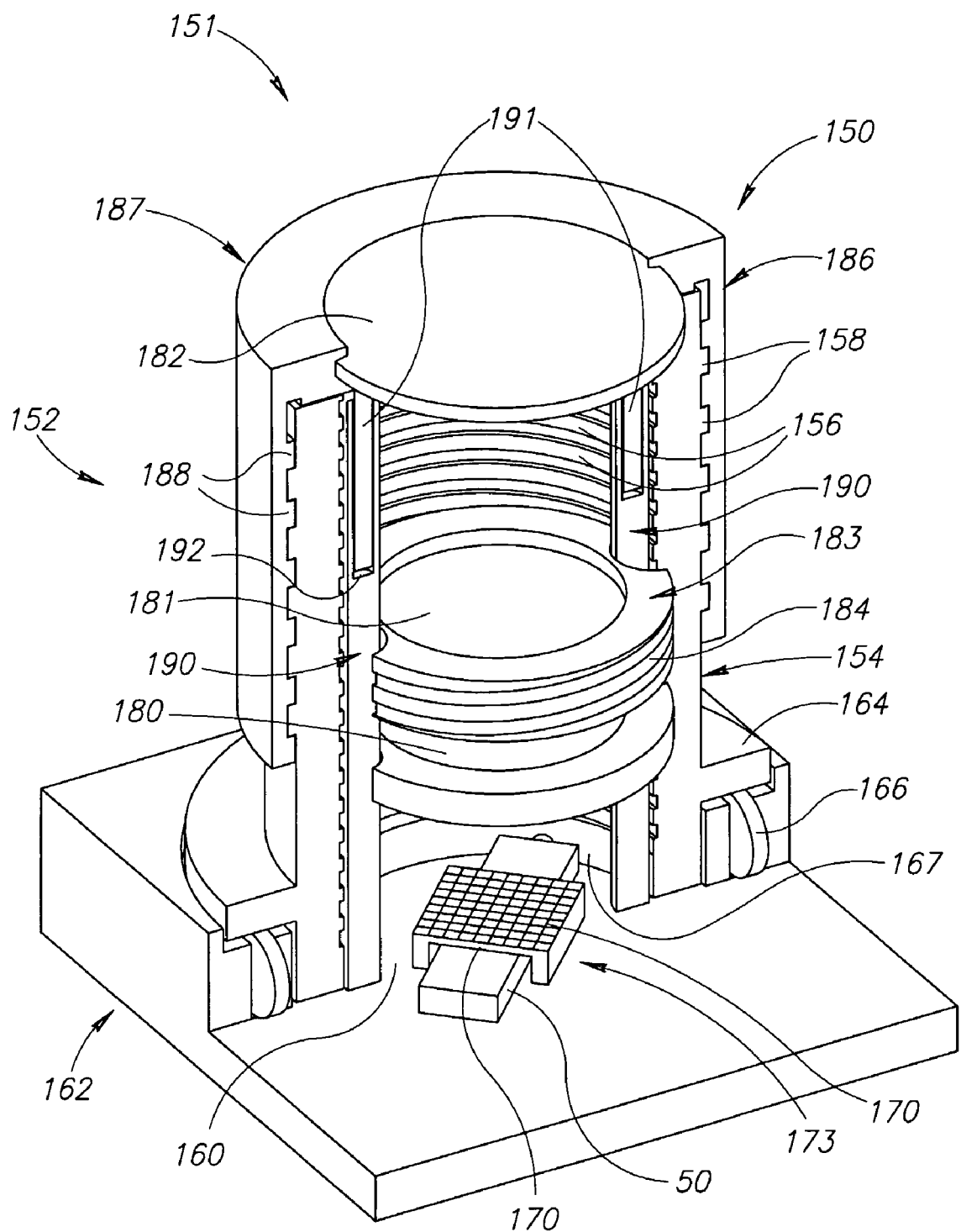
FIG. 1G schematically shows a turret-drive system comprising to two carrier platforms adapted to move lenses in a mechanically compensated zoom lens system that provides a continuous range of magnifications, in accordance with an embodiment of the present invention.

FIG. 1G schematically shows a cut-away view of a turret-drive system 150 comprising two carrier platforms, each of which is coupled to threads on a drive-tube, in accordance with an embodiment of the invention. In the figure, by way of example, turret-drive 150 is comprised in a camera 151 and adapted to move and position lenses in a mechanically compensated zoom lens system of the camera that provides a continuous range of magnifications, in accordance with an embodiment of the present invention.

Turret-drive 152 comprises a drive-tube 154 formed with a first set of threads 156 on the inside of the drive-tube and a second set of threads 158 formed on the outside of the drive-tube. The drive-tube optionally seats in a well 160 of a base 162 and has a rotation collar 164 that rides on bearings 166 mounted in base 162 so that the drive-tube is able to rotate freely about its axis. Optionally, drive-tube 154 is rotated by a piezoelectric motor 50 located inside the drive-tube at the bottom of well 160 and whose friction nub 56 contacts a region 167 of the inside surface of drive-tube 154.

Camera 151 comprises a photosurface 170 located on a support platform 173 that lies over piezoelectric motor 50.

The zoom lens system optionally comprises a stationary focusing lens or lens system 180 and first and second moveable lenses or lens systems 181 and 182. First moveable lens 181 is mounted to a first carrier platform 183 located inside drive-tube 154 and having threads 184 that mesh with first threads 156. Second moveable lens 182 is mounted to a second carrier platform 186 that has a tube 187 that fits over drive-tube 154 and is formed with threads 188 that mesh with second threads 158 of the drive-tube. Carrier platform 183 and 186 is prevented from rotating when drive-tube 154 rotates by guide rails 190. Carrier platform 186 is prevented from rotating when drive-tube 154 rotates, optionally by guide rails 191 that are attached to the carrier platform and optionally fit into holes 192 formed in guide rails 190.

When piezoelectric motor 50 rotates, drive-tube 154, first and second lenses 181 and 182 are translated along drive-tube 154 at speeds determined by the pitches of threads 156 and 158 respectively. The pitches are determined using methods known in the art so that positions of lenses 181 and 182 provide satisfactory focusing of an image of a scene for a continuous range of magnifications. By way of example, in FIG. 1G drive-tube threads 158 have a relatively course pitch and drive tube threads 156 have a relatively fine pitch. As a result, as is generally required in mechanically compensated zoom lens system, "objective" lens 182 moves a greater distance towards or away from a scene being imaged by camera 151 per turn of drive-tube 154 than does lens 181.

Figure 1H:
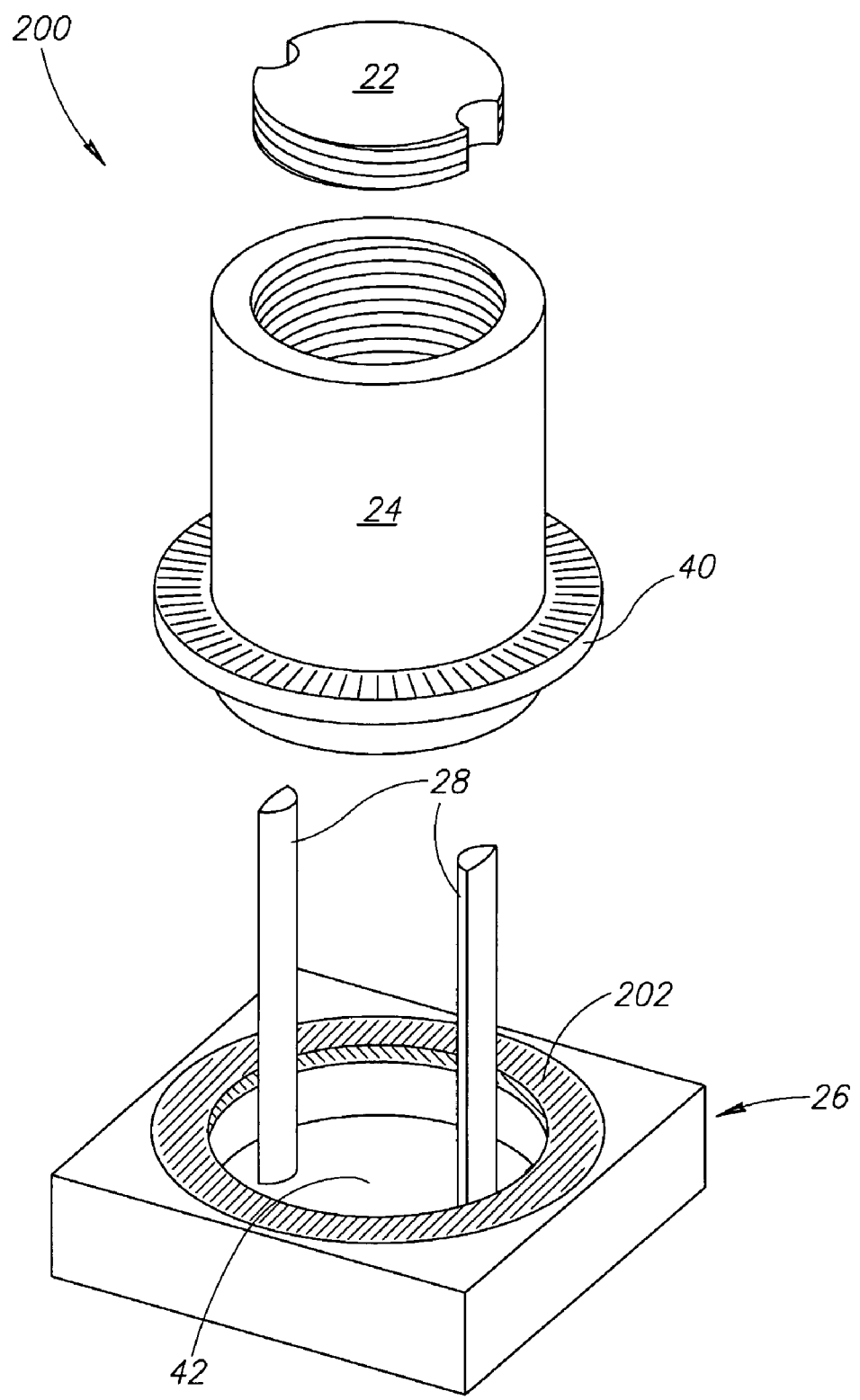
FIGS. 1H and 1I schematically show an exploded and assembled view of another turret-drive system respectively, in accordance with an embodiment of the present invention.
Figure 1I:
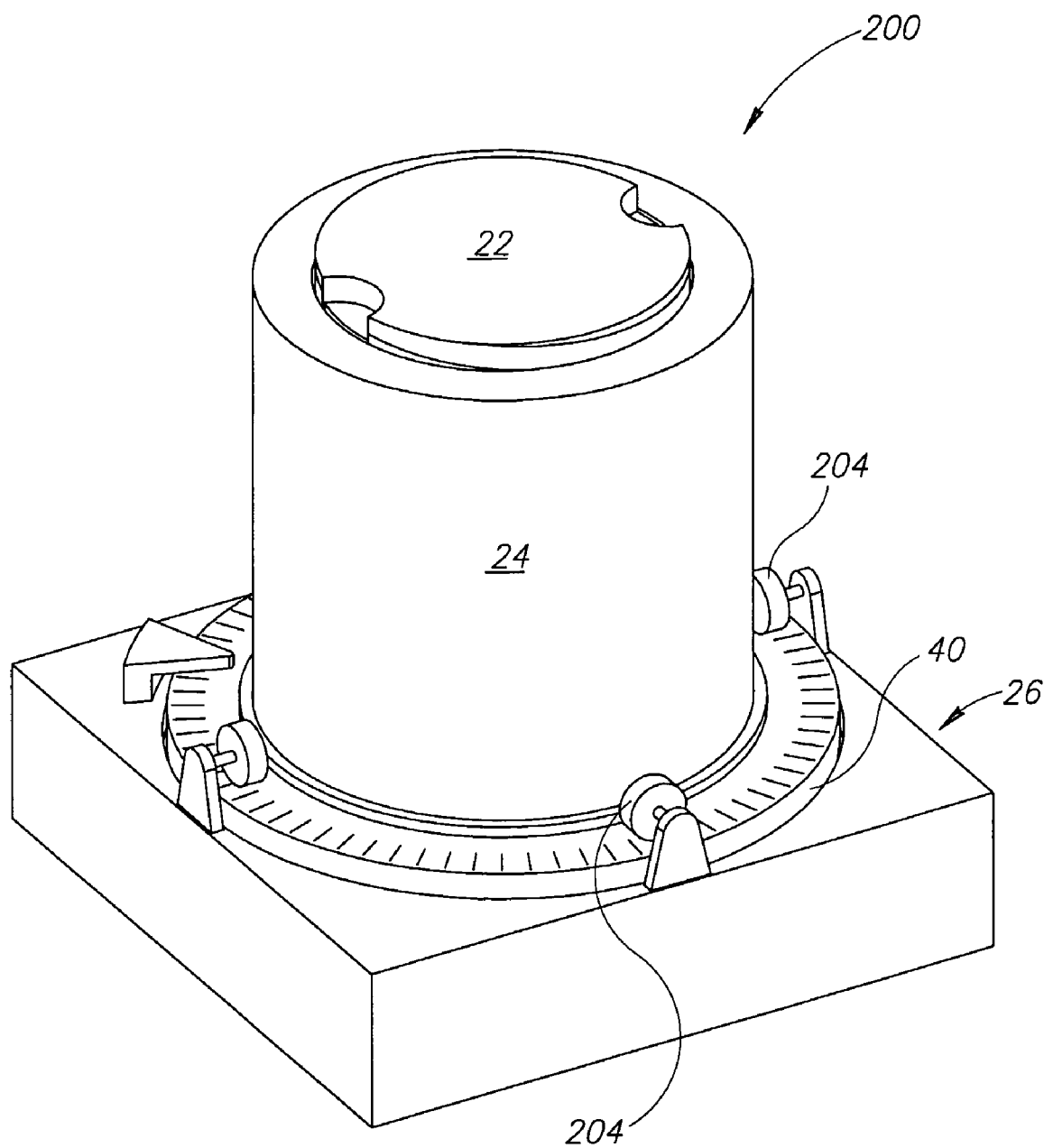

FIGS. 1H and 1I schematically show an exploded and assembled view of another turret-drive system 200, in accordance with an embodiment of the present invention.

Turret-drive systems 200 is similar to turret-drive system 20 and includes a drive-tube 24 having a drive collar 40, a base 26 that has a well 42 and guide rails 28 (FIG. 1H). However, in turret-drive 200, drive-tube 24 is driven by an annular piezoelectric motor 202 (FIG. 1H) that is positioned around the rim of well 42. When assembled (FIG. 1I), drive collar 40 is resiliently pressed to annular piezoelectric motor 202 by a plurality of bearings schematically represented by wheels 204 in FIG. 1I. Clockwise and counterclockwise traveling waves are selectively excited in annular motor 202 to rotate drive-tube 24 clockwise and counterclockwise respectively and translate carrier platform 22 along the drive-tube.

Figure 2A:
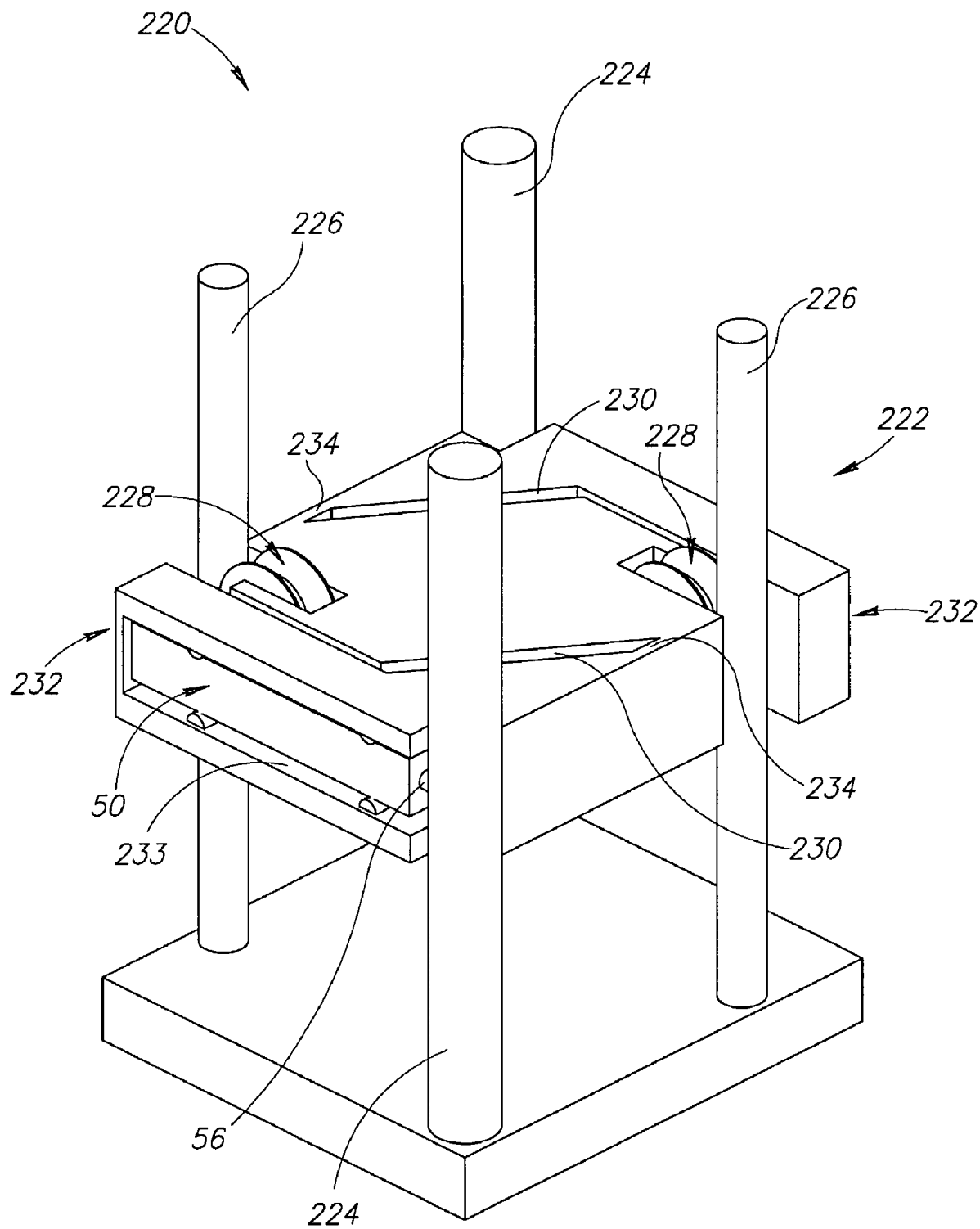
FIGS. 2A and 2B schematically show perspective and plan views respectively of a shinny-drive system, in accordance with an embodiment of the present invention.
Figure 2B:
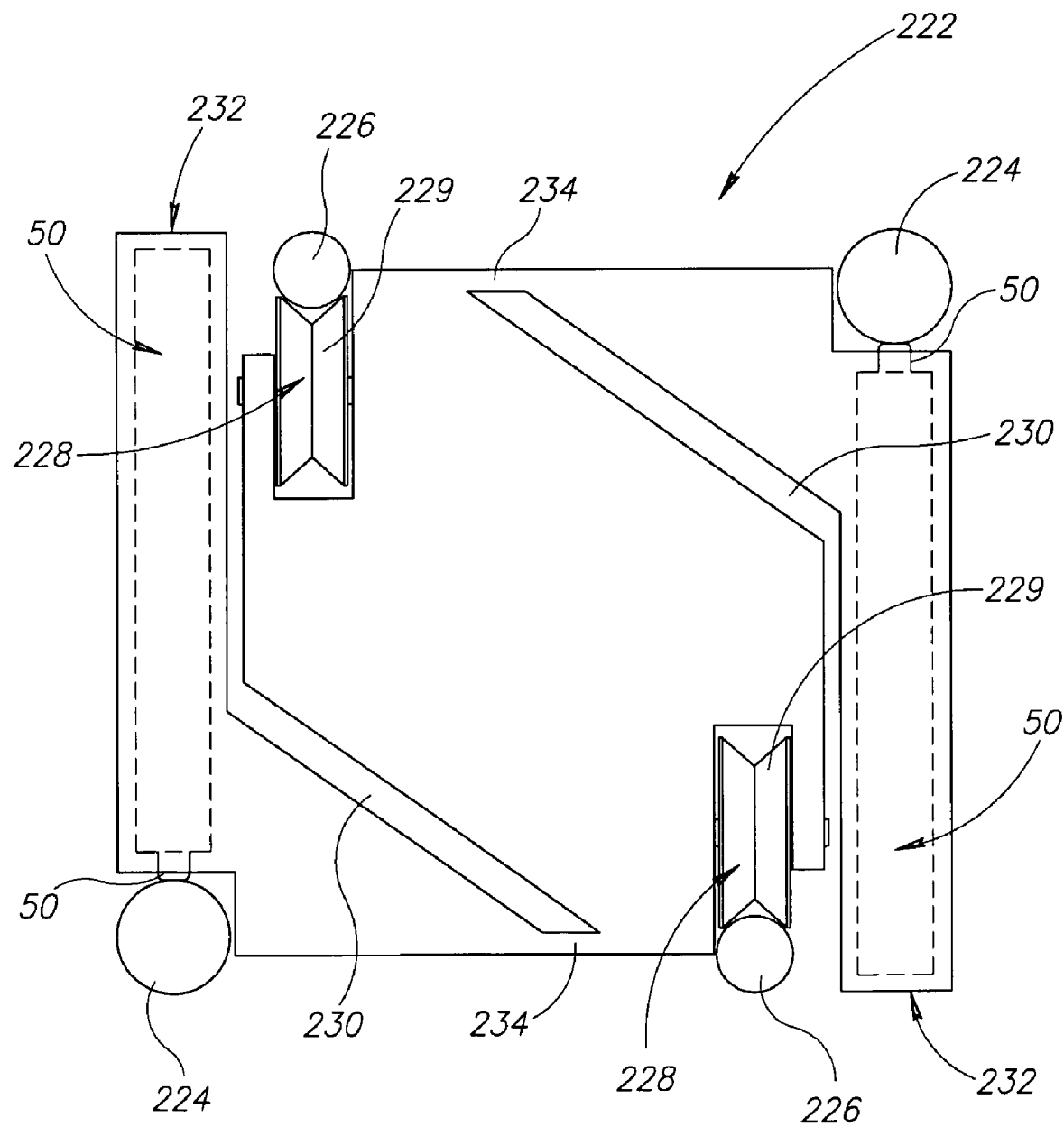

FIGS. 2A and 2B schematically show respectively a perspective view and a plan view of a shinny-drive 220, in accordance with an embodiment of the invention. Shinny-drive 220 comprises a carrier platform 222 and optionally two drive rails 224 and two guide rails 226.

In accordance with an embodiment of the invention, for each guide rail 226 carrier platform 222 comprises at least one guide wheel 228 that rides along the guide rail. Optionally platform 222 is formed with two slots 230, each of which defines an arm 232 that is attached to the main body of the platform by a relatively thin neck 234. A piezoelectric motor 50 is mounted in a recess 233 in each arm 232.

Slot 230 and the relatively thin neck 234 associated with an arm 232 enables the arm to resiliently bend about an axis substantially perpendicular to the plane of platform 222 that is located in the region of neck 234. In accordance with an embodiment of the invention, slots 230 and/or arms 232 are configured, and/or drive and guide rails 224 and 226 positioned, so that when platform 222 is mounted to the rails, arms 232 bend and "compress" toward the main body of body of platform 222. As a result, the arms generate a resilient torque that urges each piezoelectric motor 50 towards its associated drive rail 224 so that the motor's friction nub 56 resiliently contacts the drive rail and guide wheels 228 resiliently press guide rails 226. Guide wheels 228 and guide rails 226 are formed so as to minimize lateral motion of the guide wheels relative to the rails and maintain the position of carrier platform 222 accurately registered to the drive and guide rails. Optionally this is accomplished by forming the circular surface of each guide wheel 228 with a groove 229 (shown in FIG. 2B) into which its associated guide rail fits.

Platform 222 is controlled to selectively move up or down drive and guide rails 224 and 226 by electrifying electrodes in piezoelectric motors 50 to excite appropriate, optionally elliptical vibrations in friction nubs 56. The vibrations cause the motors and thereby the platform to respectively "shinny" up or down the rails. Optionally, a drive rail 224 is made from a wear resistant material and/or a region along of the drive rail that is contacted by friction nub 56 is covered with a protective wear resistant material.

Whereas in FIGS. 2A and 2B shinny-drive 220 is shown comprising a single platform 222 in some embodiments of the invention a plurality of platforms, optionally similar to platform 222 are comprised in a shinny-drive. The position of each platform along the guide and drive rails of the shinny system is independently controlled by the motors mounted to the platform. A shinny-drive comprising a plurality of carrier platforms, in accordance with an embodiment of the invention, may be adapted to control the position of each lens in a plurality of moveable lens of a zoom lens system independently of the position of the other lenses in the system. A zoom lens system that uses such a shinny-drive is therefore, in general, more flexible than a zoom lens system that uses a turret-drive and can generally can be configured to provide a greater continuous range of magnification than that provided by a zoom lens system motivated by a turret-drive.

In some embodiments of the invention, a number of drive and guide rails is different from that shown in FIGS. 2A and 2B and/or a method of coupling a piezoelectric motor to a drive rail is different from that shown in the figures.

Figure 2C:
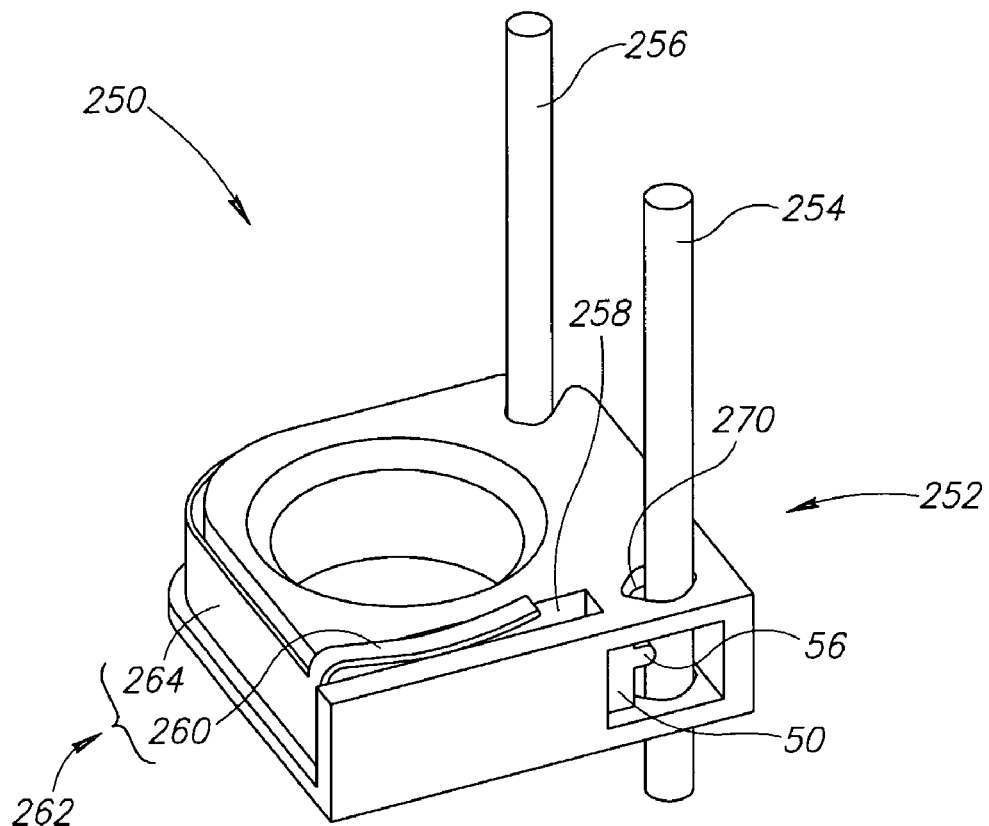
FIGS. 2C and 2D schematically show perspective and plan views respectively of another shinny-drive system in accordance with an embodiment of the present invention.
Figure 2D:
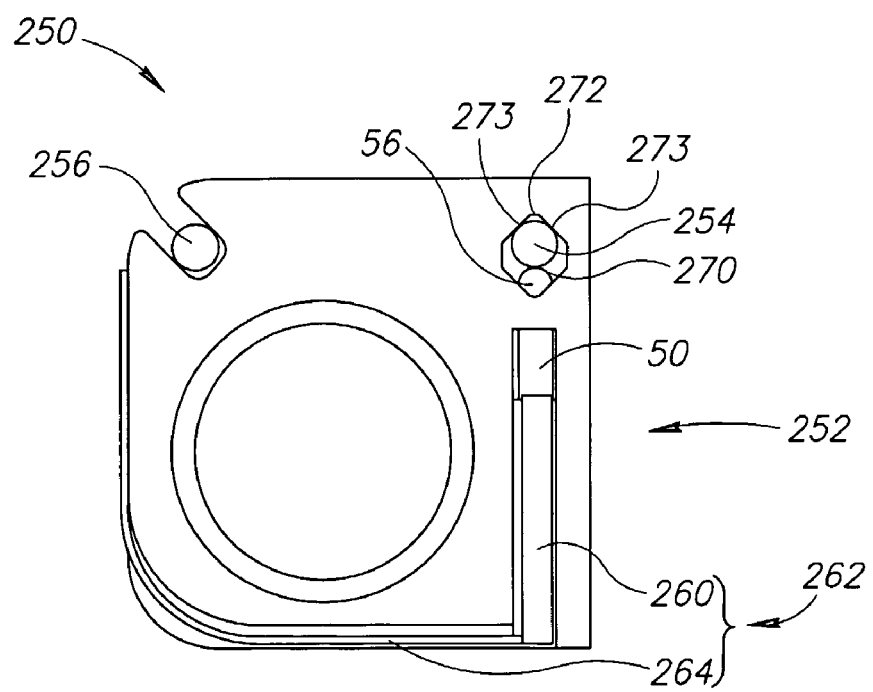

FIGS. 2C and 2D schematically show a perspective view and a plan view of a shinny-drive system 250 in which a carrier platform 252 is coupled to a single drive rail 254 and a single guide rail 256 and is driven by a single piezoelectric motor 50.

Motor 50 is optionally mounted in a slot 258 formed in platform 252 and held in place optionally by a tine 260 of a leaf spring 262. A main band 264 of the leaf spring is attached to carrier platform 252 using any of various methods known in the art and operates to urge the motor towards drive rail 254 so that friction nub 56 resiliently presses against the rail. In an embodiment of the invention, drive rail 254 passes through a hole 270 formed in platform 252 so that a relatively small region or regions of a wall that defines a part of the hole contacts the rail and provides a low friction "backstop" against which the drive rail is pressed by friction nub 56. Optionally, hole 270 is shaped having a corner 272 formed by two walls 273 into which drive rail 254 is pressed by force applied to the drive rail by friction nub 56 and the drive rail contacts each wall 273 in a relatively small region. In some embodiments of the invention, leaf spring 262 presses drive rail 254 against at least one bearing mounted to carrier platform 252 rather than a region of hole 270. The at least one bearing is optionally configured to stabilize drive rail 254 against lateral displacement of the guide rail perpendicular to its length.

Whereas in FIGS. 2A-2D drive and guide rails are indicated as being straight, in some embodiments of the invention the guide and drive rails are curved. In addition, whereas carrier platform shown in FIGS. 1A-2D and figures below are shown as planar platforms, the invention is not limited to planar platforms. A platform or platforms comprised in transport systems in accordance with an embodiment of the invention may have non-planar surfaces and/or be formed with features, such as protuberances used to mount objects to the platforms, that break planar symmetry of the platforms.

Figure 3A:
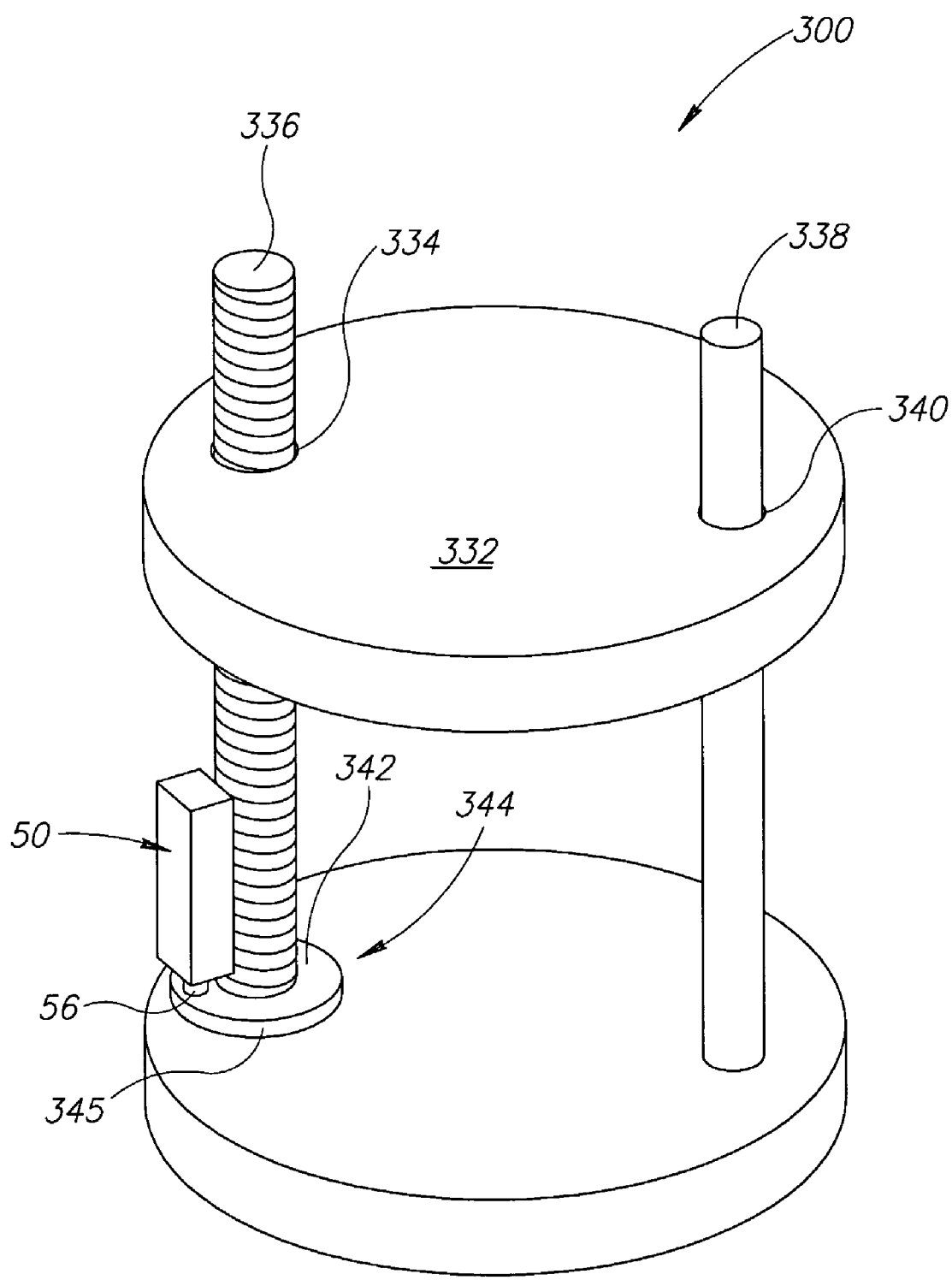
FIG. 3A schematically shows a worm-drive system, in accordance with an embodiment of the present invention.

FIG. 3A schematically shows a worm-drive system 300, in accordance with an embodiment of the invention.

Worm-drive system 300 comprises at least one carrier platform 332 formed with at least one threaded hole 334 and a threaded "worm-drive" shaft 336 that passes through the hole and whose threads mesh with the threads in the hole. Optionally, at least one guide rail 338 passes through a clearance hole 340 in carrier platform 332. By way of example, worm-drive 300 comprises a single carrier platform 332 coupled to a single worm-drive shaft 336 and a single guide rail 238.

Worm-drive shaft 336 is coupled to at least one piezoelectric motor controllable to rotate the worm-drive shaft selectively clockwise or counterclockwise about the drive shaft axis and therefore, because guide rail 338 prevents rotation of carrier platform 332, selectively translate the platform along either of the two directions along the drive shaft. Optionally, the drive shaft is coupled to a piezoelectric motor 50 similar to that shown in FIGS. 1A and 1B. The motor is urged towards a contact surface attached to or comprised in the drive shaft so that the motor's friction nub resiliently contacts the contact surface, which contact surface the motor rotates in order to rotate the drive shaft. Optionally the contact surface is a planar surface having a normal parallel to the axis of drive shaft 336. Optionally, as shown in FIG. 3A, the planar contact surface is a planar surface 342 of a disc 344 attached to or integrally formed with drive shaft 336. In some embodiments of the invention, the contact surface is a circularly cylindrical surface having an axis of rotation coincident with the axis of drive shaft 336. Optionally the cylindrical surface is a circularly cylindrical edge surface of a disc, such as surface 345 of disc 344. Optionally, the contact surface is a region of drive shaft 336 formed without threads and optionally covered with a wear resistant material suitable for contact with friction nub 56. Any of many varied devices and methods known in the art may be used to position and urge the motor towards the contact surface.

Figure 3B:
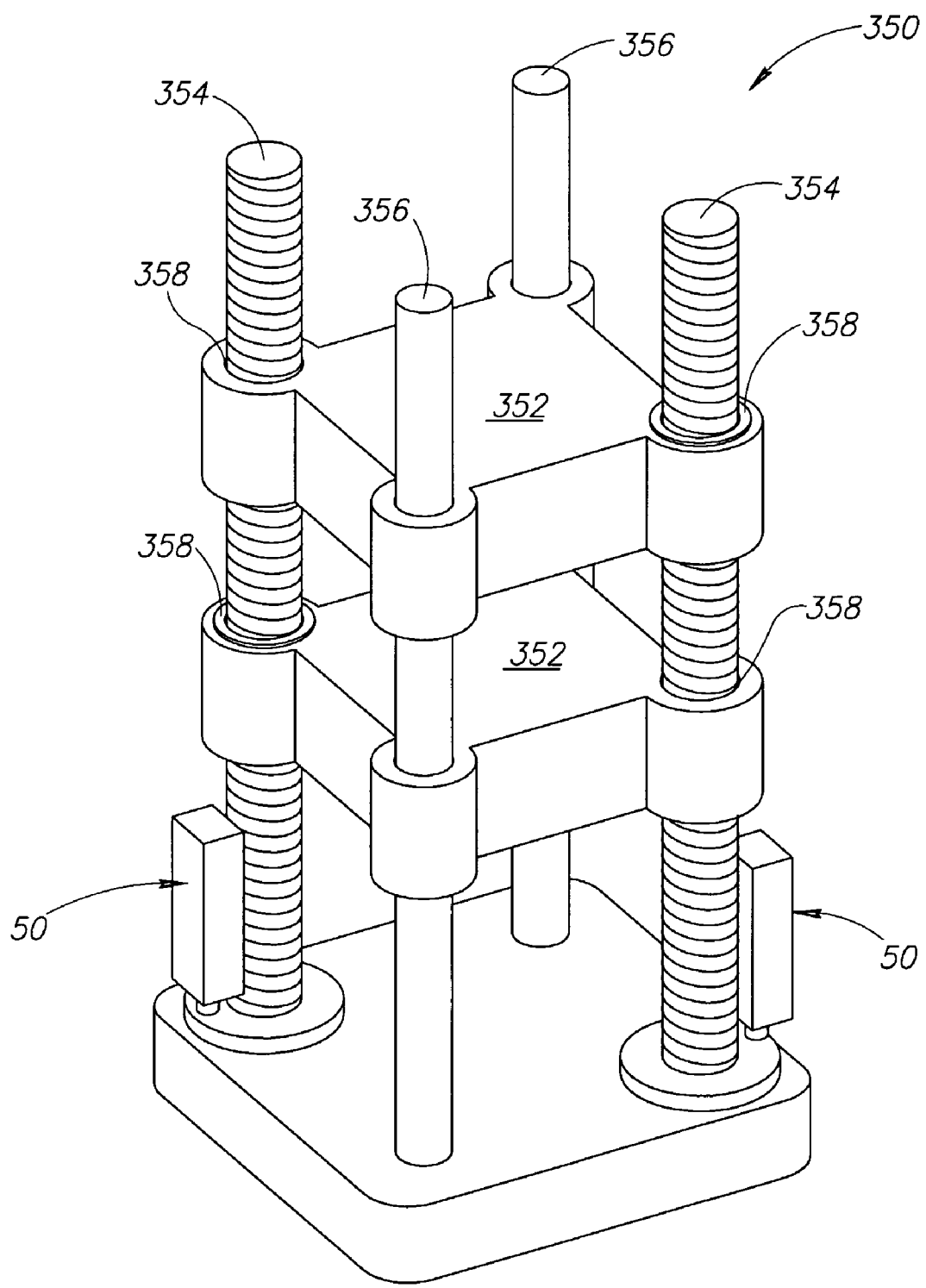
FIG. 3B schematically shows another worm-drive system in accordance with an embodiment of the present invention.

FIG. 3B schematically shows a worm-drive system 350 that comprises a plurality of two carrier platforms 352, each coupled to a different worm-drive shaft 354 rotated by a piezoelectric motor 50. Optionally, worm-drive 350 comprises at least one guide rail that passes through a clearance hole in each carrier platform 352. By way of example, worm-drive 350 comprises two guide rails 356 each of which passes through both carrier platforms. Whereas, by way of example, both worm-drive shafts 354 pass through holes 358 in each platform, only one of holes 358 in each platform through which the worm-drive shafts pass is formed with threads that mesh with the threads of a shaft. The other hole 358 functions a clearance hole. Furthermore, each worm-drive shaft 354 passes through a hole 358 with threads in only one of carrier platforms 352. Each drive shaft 354 is therefore coupled to control motion and position only one of carrier platforms 352 and motion and position of each carrier platform 352 is controllable independent of motion and position of the other platform by rotating the particular drive shaft 354 to which it is coupled.

Worm-drive systems in accordance with embodiments of the invention may have configurations different from those shown in FIGS. 3A and 3B. For example, a worm-drive system in accordance with an embodiment of the invention, similar to that shown in FIG. 3B may comprise more than two carrier platforms for each of which motion and position is controllable independently of the motion and position of the others by a different drive shaft and associated piezoelectric motor. By way of another example, a same carrier platform may be coupled to a plurality of drive shafts, each coupled to a different threaded hole in the carrier platform, that cooperate synchronously to move and position the carrier platform.

Worm-drive systems, as with other transport systems in accordance with an embodiment of the invention, may be adapted for various motion applications. In particular, worm-drive systems may be adapted to move and position lenses in optical systems such as optical systems comprised in cameras.

Figure 4A:
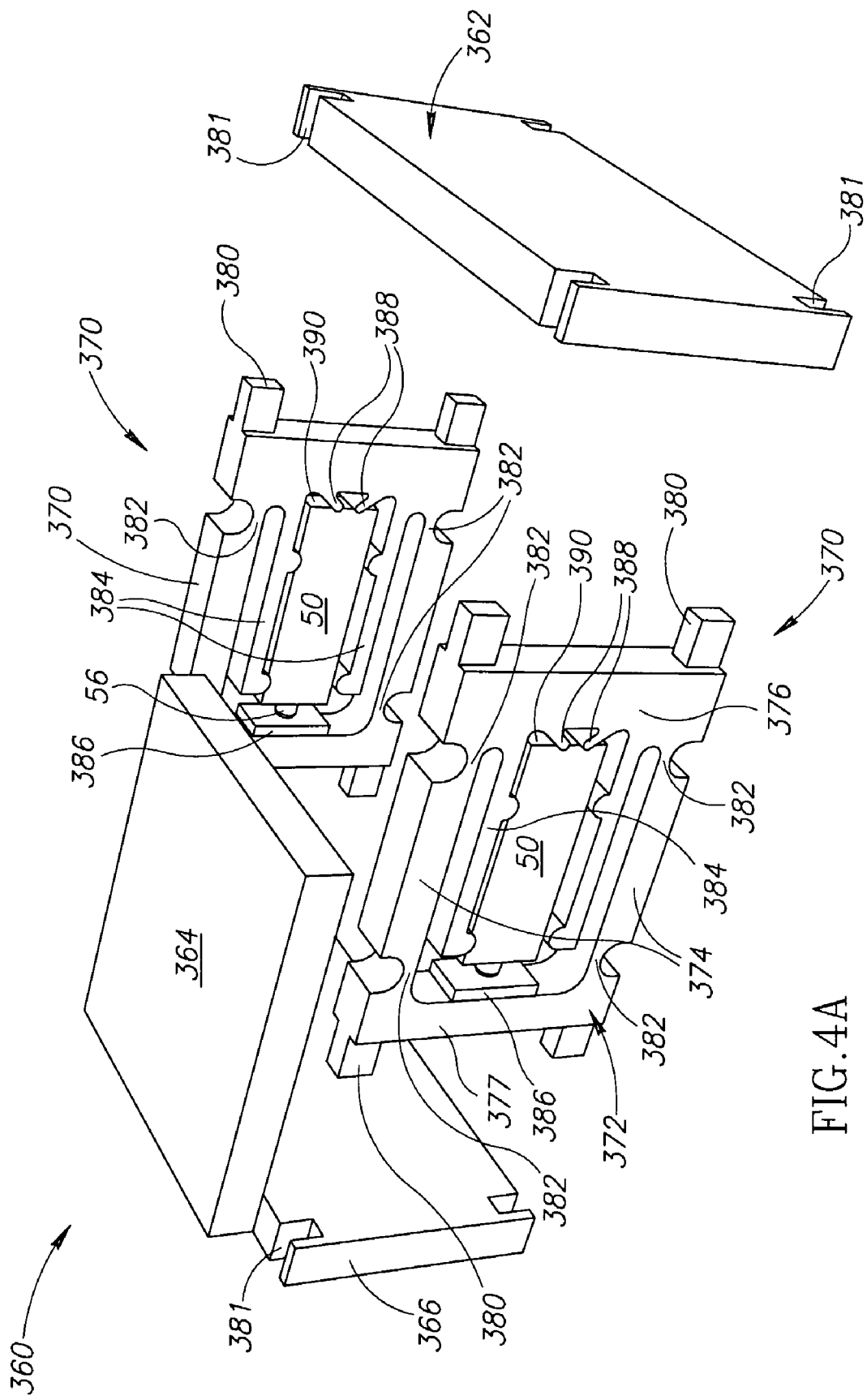
FIGS. 4A and 4B schematically show an exploded view of a deformation-drive system and a view of the assembled system respectively, in accordance with an embodiment of the present invention.
Figure 4B:
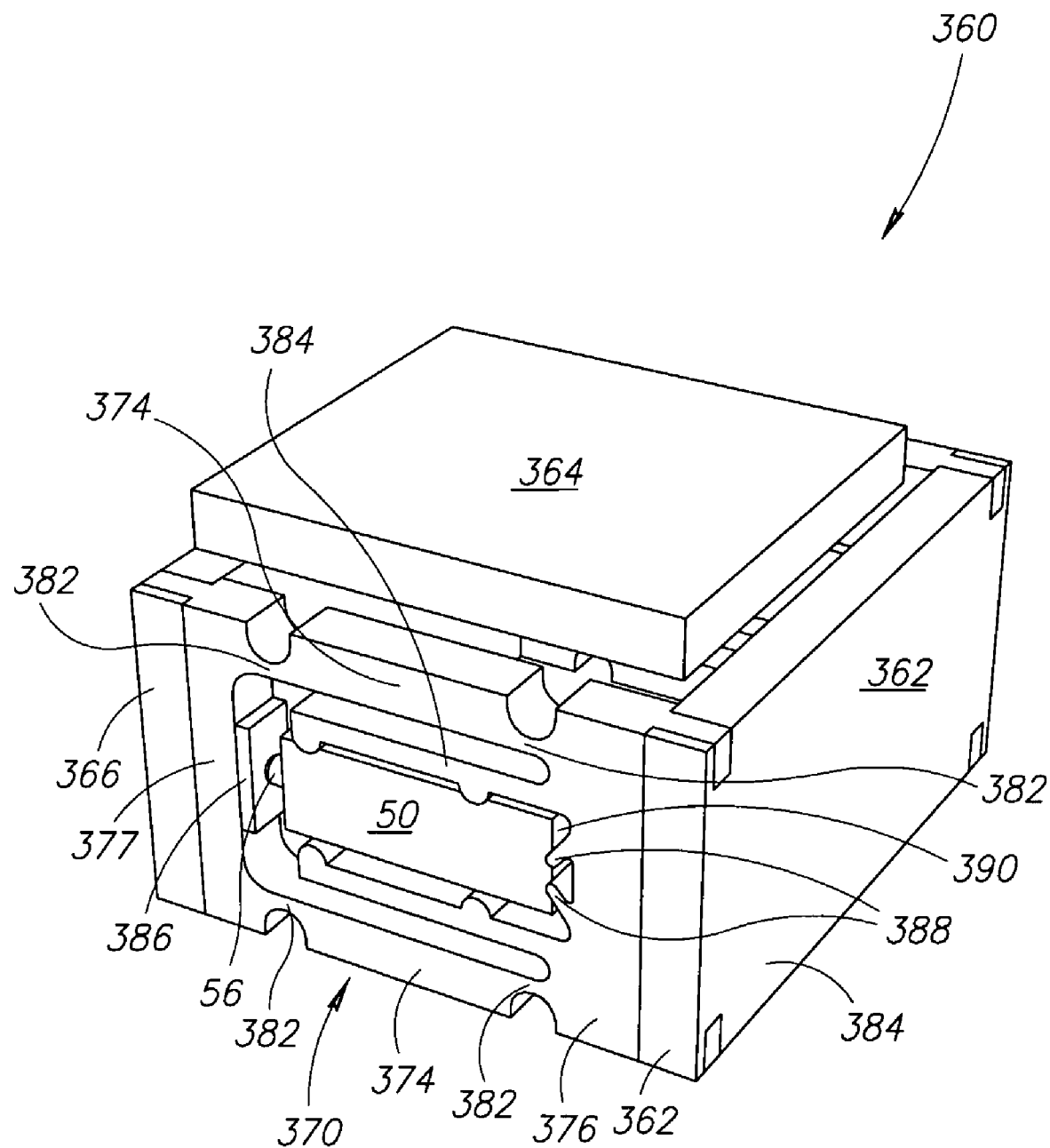

FIGS. 4A and 4B schematically show an exploded and assembled view of a deformation-drive system 360 respectively, in accordance with an embodiment of the invention.

Deformation-drive system 360 optionally comprises a base plate 362, a carrier platform 364 optionally connected to a carrier platform attachment panel 366 and optionally two deformable couplers 370. Each deformable coupler 370 comprises an optionally rectangular or square frame 372 having top and bottom sides 374, hereinafter referred to as "deformation arms", and lateral sides 376 and 377, hereinafter referred to respectively as a base side 376 and a motion side 377.

Deformable "frames" 370, base plate 362 and platform attachment panel 366 are assembled together to form deformation-drive system 360 configured as shown in FIG. 4B using any methods known in the art. For example, the various components may be glued, welded and/or snapped together using various types of snap locks, depending on the material or materials from which the components are made. Optionally, as shown in FIGS. 4A and 4B, assembly is aided using tongues 380 and matching grooves 381, optionally having a shape similar to that shown in the figures. By way of example, assuming that deformable frames 370, base plate 362 and attachment panel 366 are made of plastic they may be assembled using the tongues and grooves and then ultrasonically welded.

Each deformation arm 374 of a deformable frame 370 has a portion 382 near each of its ends that is relatively thin along a dimension parallel to the plane of the frame. The frame is therefore relatively easily deformable in its plane into parallelograms of different heights, i.e. distances between deformation arms 374. Optionally, each deformable frame 370 comprises a piezoelectric motor 50 held between two mounting arms 384 that extend from base side 376. Motion side 377 of frame 370 optionally comprises a contact plate 386 made from a wear resistant material. Piezoelectric motor 50 is resiliently urged towards contact plate 386 by an elastic member located in base side 376 of frame 370 so that its friction nub 56 contacts the contact plate. Optionally, the elastic member comprises a pair of prongs 388 formed or mounted in base side 376 that exert a resilient force on an edge 390 of piezoelectric motor 50. Optionally, deformable frame 370, exclusive of contact plate 386 and piezoelectric motor 50, is formed as a single integral manufacture from a suitably resilient plastic. For example, deformable frame 370 may be cast as a single piece.

Each piezoelectric motor 50 is operable to apply forces to contact plate 386 that deform frame 370 into a parallelogram of desirable height. By deforming frames 370, carrier platform and components mounted thereto may be moved and displaced by desirable distances perpendicular to the plane of the platform.

Figure 4E:
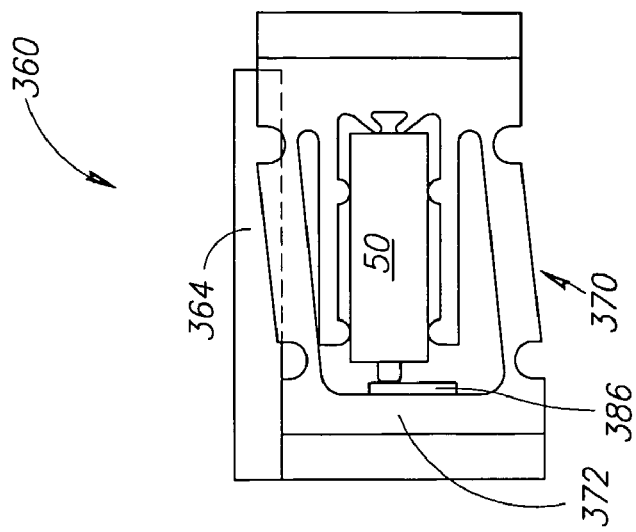
FIGS. 4C, 4D and 4E show schematic side views of the deformation-drive system shown in FIGS. 4A and 4B that illustrate operation of the system, in accordance with an embodiment of the present invention.
Figure 4D:
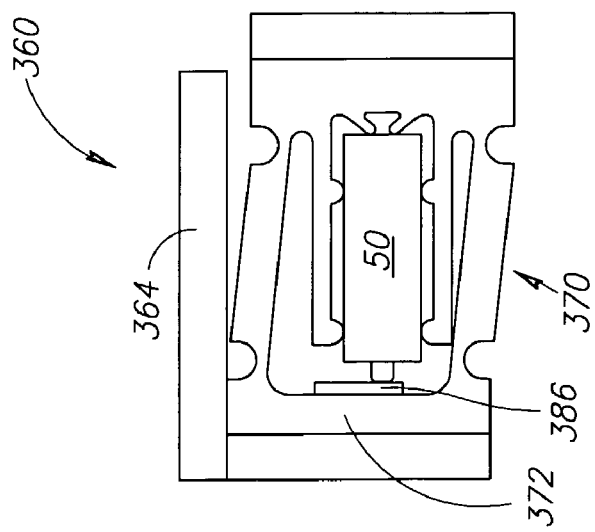
Figure 4C:
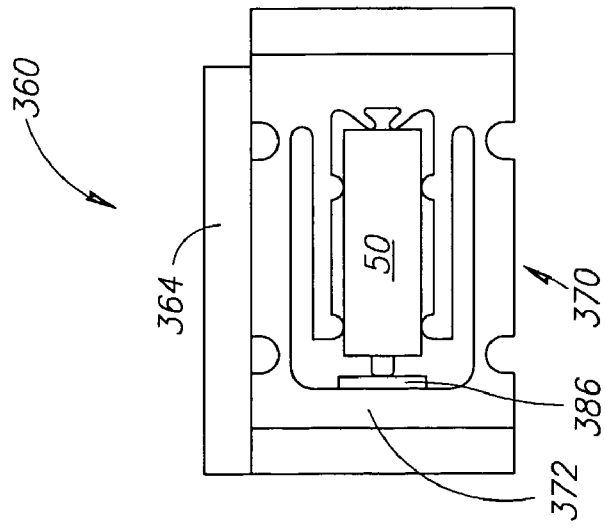

The operation of piezoelectric motors 50 to deform deformable frames 370 and displace carrier platform 364 is illustrated in FIGS. 4C-4E, which show schematic side views of deformation-drive system 360. In FIG. 4C, piezoelectric motors 50 are not operated to deform deformable frames 374. The frames assume their un-deformed, optionally rectangular configuration and carrier platform 364 is positioned at an "origin" position. In FIGS. 4D and 4E piezoelectric motors 50 are operated to apply forces to contact plate 386 that raise and lower motion sides 377 of deformable frames 374 and deform the frames into parallelograms to raise and lower carrier platform 364 respectively.

It is noted that deformation-drive 360 has a dynamic range of motion for carrier platform 364 that is generally substantially smaller than the dynamic range of motion provided by other transport drives in accordance with an embodiment of the invention. However, dynamic ranges available from a deformation-drive in accordance with an embodiment of the invention are often suitable for use in small systems, such as for example in a camera comprised in a cell phone. Optical systems in such cameras often comprise elements, such as lenses, that are moved over dynamic ranges of about a millimeter or a few millimeters. Such dynamic ranges are easily satisfied by deformation-drives in accordance with an embodiment of the invention.

Deformation-drive 360 is assembled from deformable frames, a matching base and a platform, that are separate pieces. In some embodiments of the invention, a deformation-drive in accordance with an embodiment of the invention, similar to deformation-drive 360 is formed, exclusive of piezoelectric motors 50 and contact plates 386, as a single integral unit.

Figure 5:
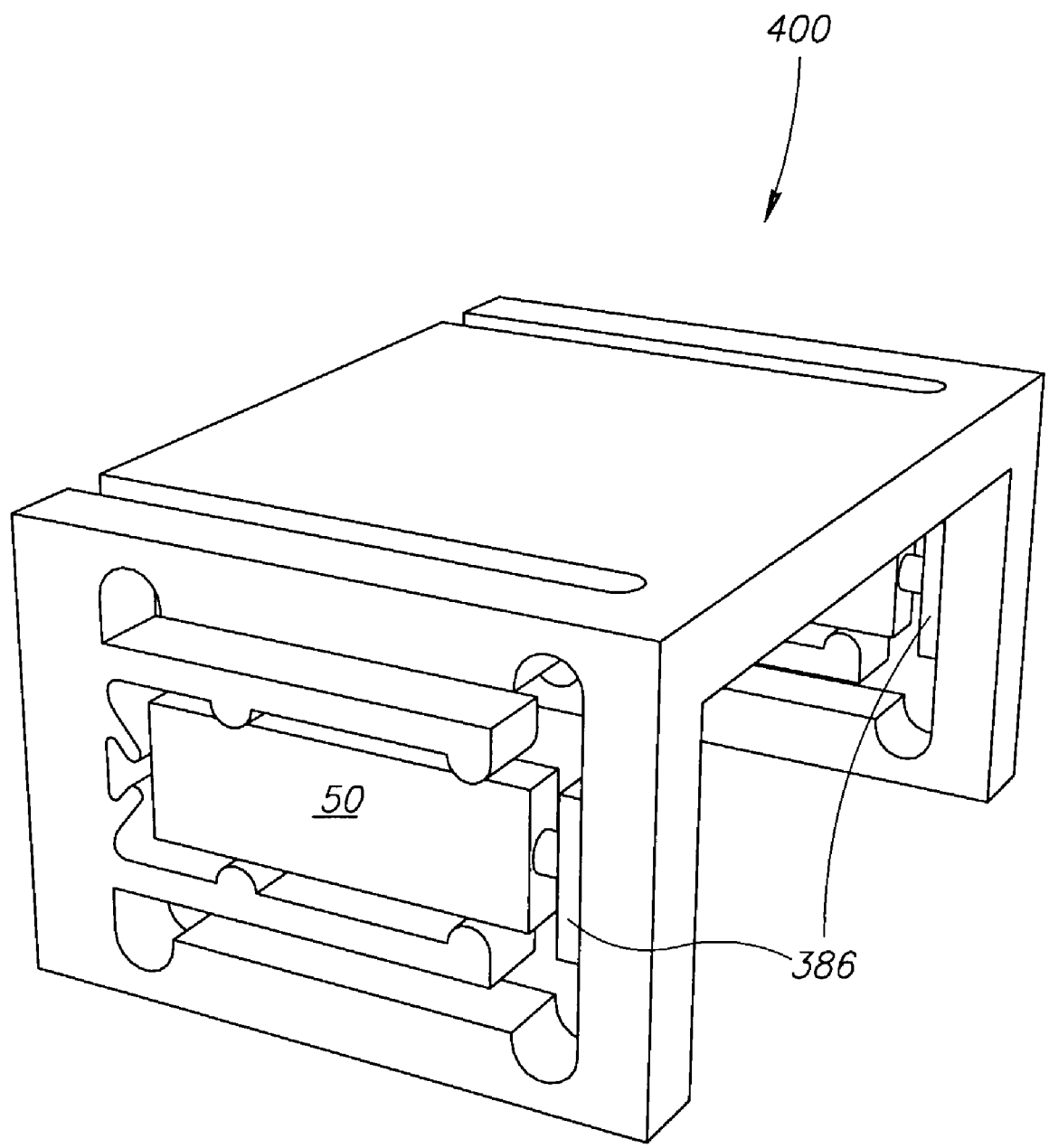
FIG. 5 schematically shows another deformation-drive system in accordance with an embodiment of the present invention.

FIG. 5, by way of example, schematically shows a deformation-drive 400, in accordance with an embodiment of the invention, which, except for piezoelectric motors 50 and contact plates 386 is suitable for casting as a single integral piece optionally from plastic.

Figure 6A:
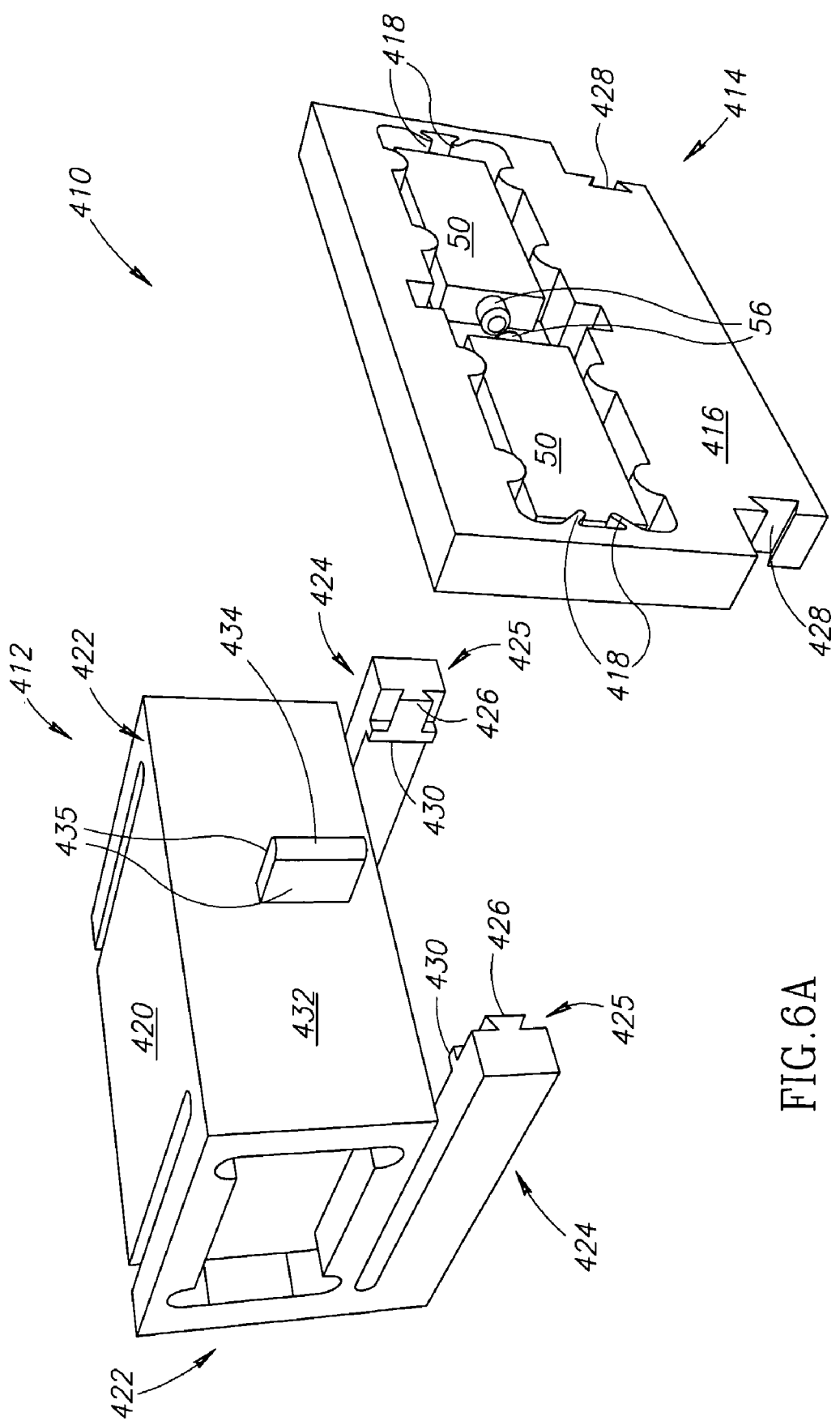
FIGS. 6A and 6B schematically show an exploded view of a deformation-drive system and a view of the assembled system respectively, in accordance with an embodiment of the present invention.
Figure 6B:
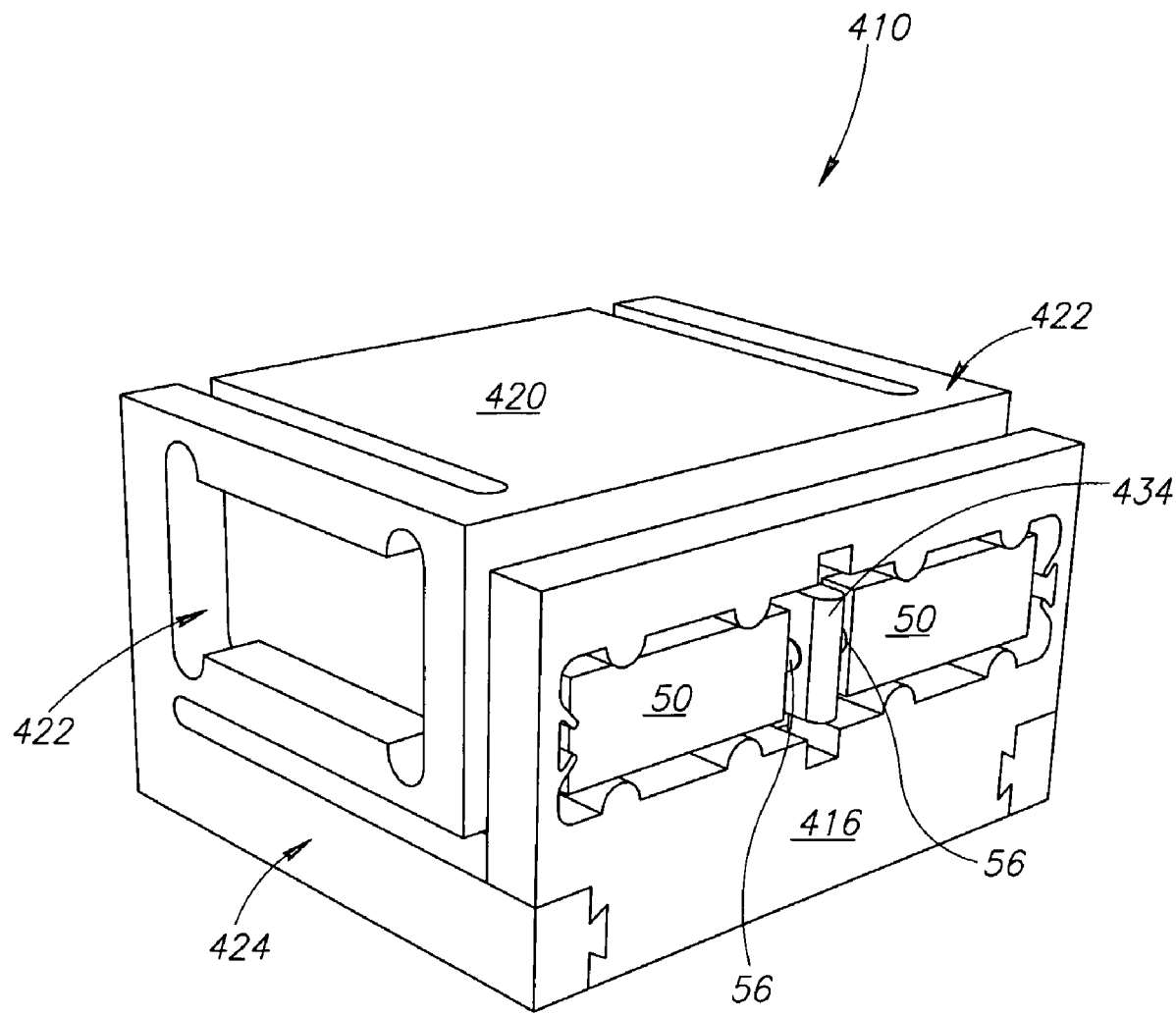

FIGS. 6A and 6B schematically show exploded and assembled views respectively of another deformation-drive 410, in accordance with an embodiment of the invention. Whereas in deformation-drives 360 and 400 (FIGS. 4A, 4B and FIG. 5), piezoelectric motors 50 that deform deformable frames 370 are located inside the frames, in deformation-drive 410 piezoelectric motors 50 are located outside of the frames. Locating piezoelectric motors outside of the deformation frames provides greater flexibility in choosing the size and orientation of the motors.

Deformation-drive 410 comprises a carrier platform unit 412 and a drive panel 414. Drive panel 414 optionally comprises a drive panel frame 416 and two mirror image piezoelectric motors 50 mounted to the frame and having their respective friction nubs 56 facing each other. Optionally, elastic prongs 418 integrally formed with frame 416 urge piezoelectric motors 50 toward each other. Carrier platform unit 412 comprises a carrier platform 420 attached to two deformable frames 422 each of which is mounted to a base arm 424. Each base arm 424 optionally has an end 425 formed with a tongue 426 shaped to match a groove 428 in drive panel frame 416 and a stop 430 that limits a depth to which tongue 426 may be inserted into groove 428. Optionally, an attachment panel 432 joins deformable frames 422 and carrier platform 420. A drive fin 434 is optionally attached to attachment panel 432 midway between the lateral edges of the panel. Drive fin 434 has surfaces 435 formed from a strong wear resistant material that are used as contact surfaces for piezoelectric motors 50.

Drive panel frame 416, as shown in FIG. 6A, is configured so that it may be formed as a single unitary piece. Optionally the drive panel frame is formed by die-casting, optionally from a plastic material. Carrier platform unit 412 as shown in FIG. 6A is also configured so that, except for drive fin 434, it may be formed as a single unitary piece, optionally by casting. Optionally, carrier platform unit 412 is die cast from a plastic.

Deformation-drive 410 is assembled by joining carrier platform unit 412 to drive panel 414. Joining is accomplished by inserting base arm tongues 426 of carrier platform unit 412 into grooves 428 of drive panel frame 416 and drive fin 434 between friction nubs 56 of piezoelectric motors 50 and optionally bonding the tongues into the grooves. Bonding is optionally performed using any bonding material suitable for use with the materials from which the surfaces of tongues 426 and grooves 428 are formed. Optionally, if drive panel frame 416 and carrier platform unit 412 are made of plastic, the tongues and grooves may be bonded using ultrasonic welding.

Deformation-drive 410 is controlled to move and position carrier platform 420 by controlling mirror image piezoelectric motors 50 to displace drive fin 434 up or down as required. Displacement of the drive fin up or down by a desired amount deforms deformable frames 422 and displaces carrier platform 420 by a corresponding desired displacement.

Figure 7A:
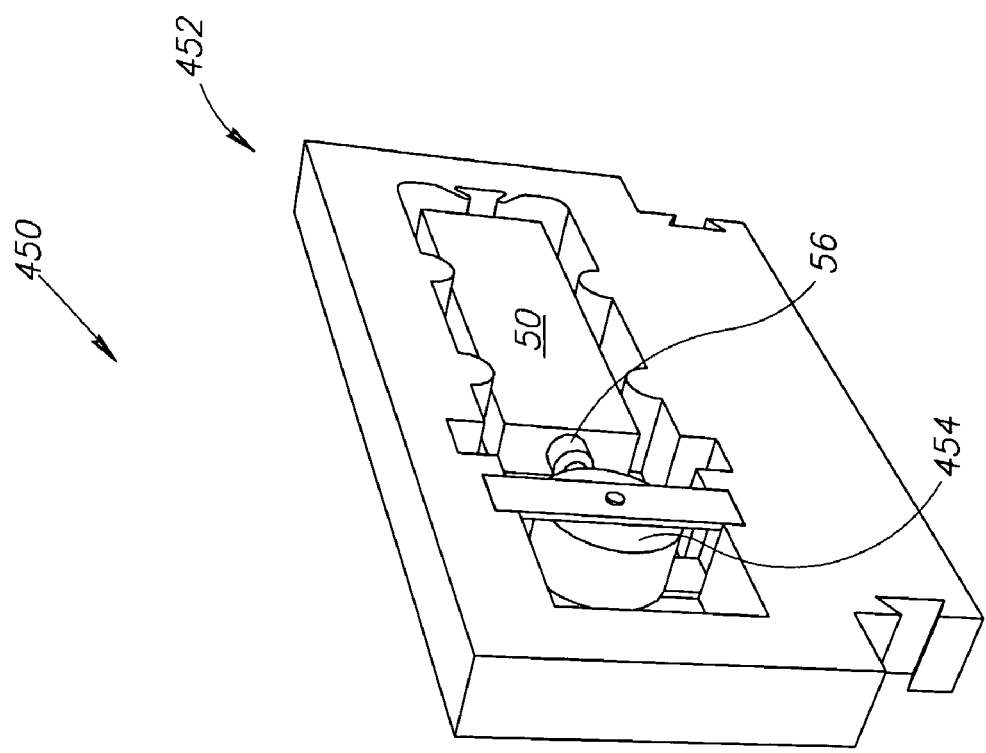
FIGS. 7A and 7B schematically show an exploded view of yet another deformation-drive system and a view of the assembled system respectively, in accordance with an embodiment of the present invention.
Figure 7A:
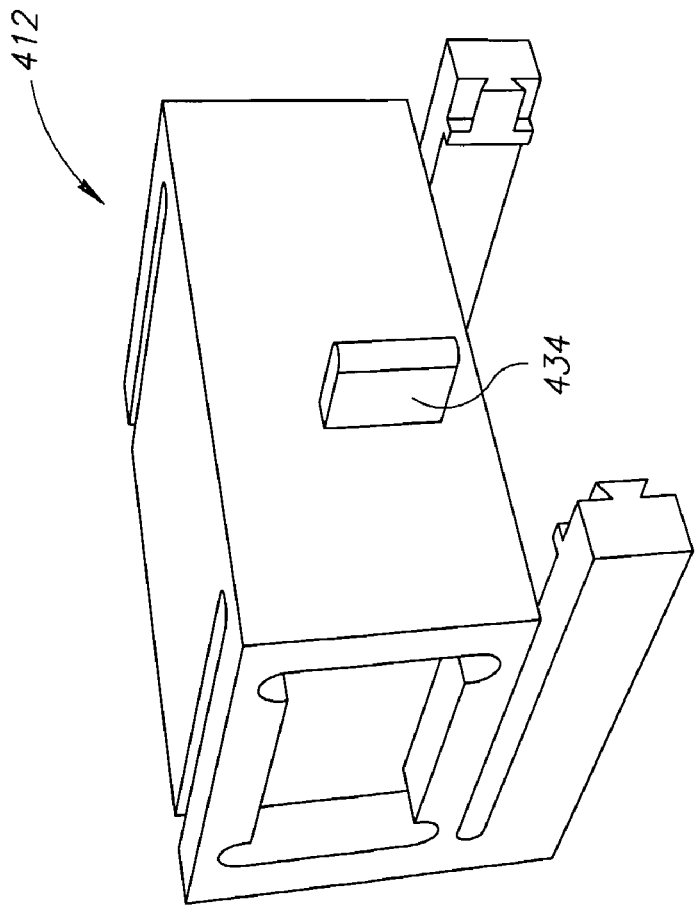
Figure 7B:
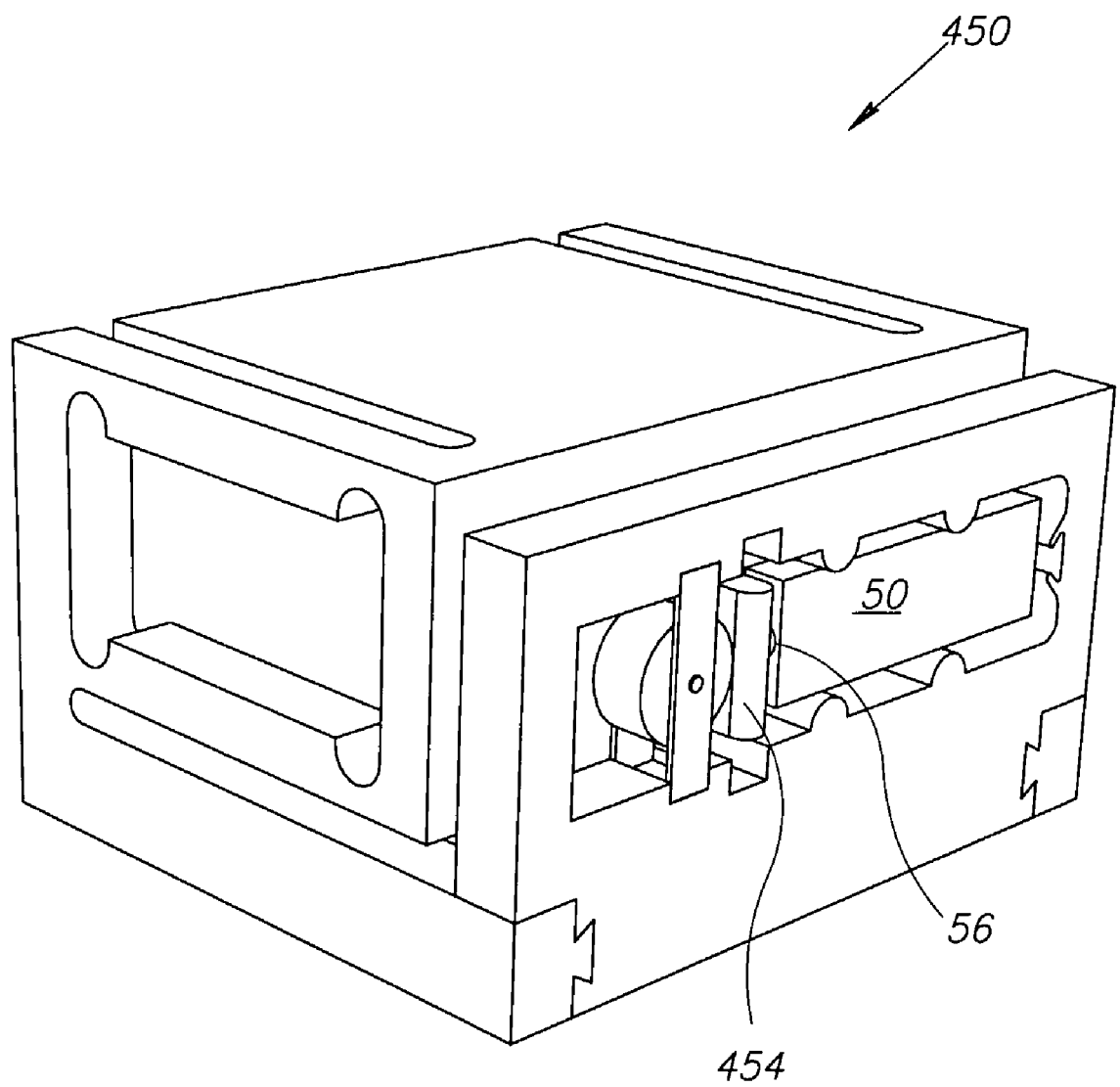

FIGS. 7A and 7B schematically show exploded and assembled perspective views of yet another deformation-drive 450, in accordance with an embodiment of the invention. Deformation-drive 450 is similar to deformation-drive 410 and comprises a carrier platform unit 412 having a drive fin 434 and a drive panel 452. However, drive panel 452 comprises only a single piezoelectric motor 50 rather than the two mirror image motors 50 comprised in drive panel 416 of deformation-drive 410 shown in FIGS. 6A and 6B. A backstop bearing, schematically represented by a wheel 454 maintains drive fin 434 in position pressed against friction nub 56 of piezoelectric motor 50 while allowing the drive fin to freely move up or down.

It is noted that whereas deformation drives shown in FIGS. 4A-4B are coupled to piezoelectric motors using a drive fin, deformation drives, in accordance with embodiments of the invention may be coupled to piezoelectric motors in other ways. For example, an attachment panel such as attachment panel 432 (FIGS. 6A and 6B) may comprise a threaded hole rather than or in addition to drive fin 434. A threaded drive shaft screwed into the hole and driven by a piezoelectric motor is optionally used to move the attachment panel.

Furthermore, a drive fin for coupling to a piezoelectric motor, may be used in other than deformation drive systems, in accordance with an embodiment of the invention. For example, a carrier platform mounted to guide rails may comprise a drive fin coupled to at least one piezoelectric motor. The at least one motor translates the drive fin to translate the carrier platform.

As noted above, a moiré pattern optical encoder may be used to determine and/or control motion and/or position of a carrier platform comprised in a transport system in accordance with an embodiment of the invention. Optionally, the moiré optical encoder is a conventional encoder. Optionally, the encoder is an encoder in accordance with an embodiment of the invention.

In a moiré pattern optical encoder for sensing motion and position of a moveable object, a photodetector detects motion of moiré pattern of light and dark fringes to detect motion and position of the object. The moiré fringes are generated by a substantially periodic pattern, formed on or attached to the object that moves with the object and a substantially periodic pattern, which filters light that enters the photodetector. The patterns are positioned close to each other and oriented so that directions along which they are respectively periodic are angled with respect to each other by a relatively small angle, hereinafter a "moiré angle". The pattern associated with the object, is hereinafter referred to as a "moveable pattern", and the pattern associated with the photodetector is hereinafter referred to as a "stationary pattern".

Generally, the stationary and moveable periodic patterns have a same period. The light and dark moiré fringes they generate are also periodic but with a period that is much greater than the period of either the moveable or the stationary pattern. (The period of the moiré pattern fringes is approximately equal to D/sin θ, where D is the period of the stationary and moveable periodic patterns and θ is their moiré angle.) A translation of the movable object and its associated moveable pattern in a direction parallel to a direction along which the moveable pattern is periodic generates a translation of the moiré fringes equal to a ratio of the period of the moiré pattern to that of the period of the moveable and stationary patterns. As a result, the detector can be used to detect relatively small changes in position of the moveable object with a relatively high degree of accuracy. For convenience of presentation, it is assumed that each of the moveable and stationary patterns is a grating of parallel straight lines.

Whereas a single photodetector can detect change of position with relatively high accuracy, signals generated by a single detector are not in general sufficient by themselves to determine in which of the two parallel directions along the direction of periodicity that the change in position occurs. Generally, to detect the direction two photodetectors are used to sense the moiré pattern. The photodetectors are spaced apart along a direction of periodicity of the moiré pattern by a distance equal to a quarter of a wavelength of the moiré pattern. As a result, the detectors generate "quadrature signals" that are out of phase with each other by 90°, which are used to determine the direction of motion.

Accurately positioning photodetectors to provide quadrature signals can often be painstaking and expensive. In addition, once positioned to monitor position of a moveable object, relatively small changes in orientation of the object can perturb the moiré angle between the stationary and moveable patterns and perturb thereby the period of the moiré fringes. A perturbation in the period of the moiré pattern changes the relative phase between the photodetectors from the desired 90° quadrature difference.

Figure 8A:
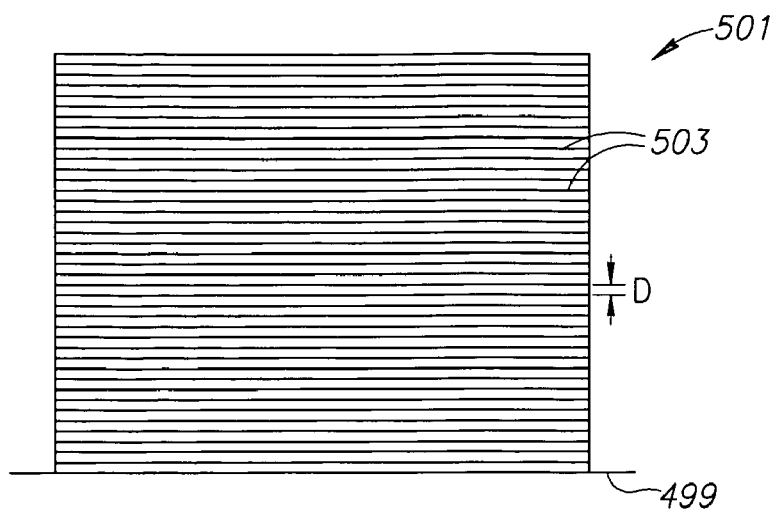
FIGS. 8A and 8B schematically show periodic patterns used to generate a moiré pattern of fringes in a moiré encoder, in accordance with prior art.
Figure 8B:
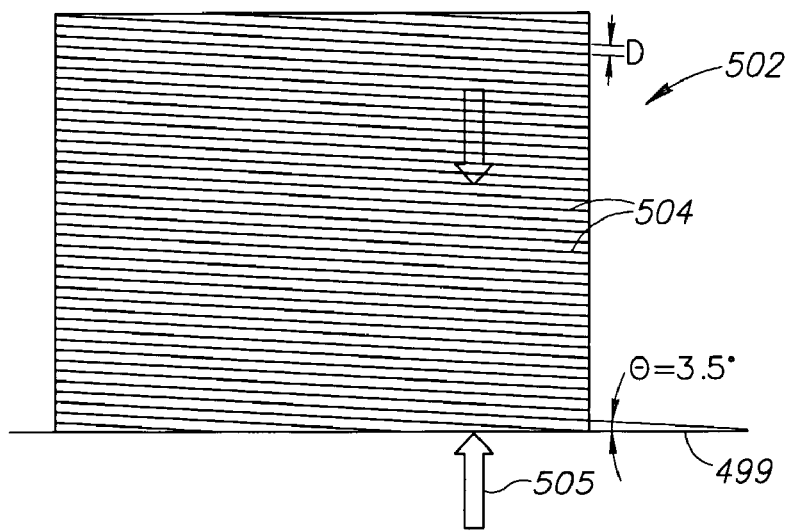

FIGS. 8A and 8B schematically show stationary and moveable line gratings 501 and 502 respectively that are used to generate a moiré pattern for an optical encoder in accordance with prior art. Grating lines 503 comprised in grating 501 are shown as having zero inclination relative to an arbitrary horizontal 499 and being spaced apart by a distance "D". Grating lines 504 comprised in moving grating 502 are optionally spaced apart by a same distance D and, by way of example, inclined by a moiré angle θ=3.5° relative to horizontal 499.

Figure 8C:
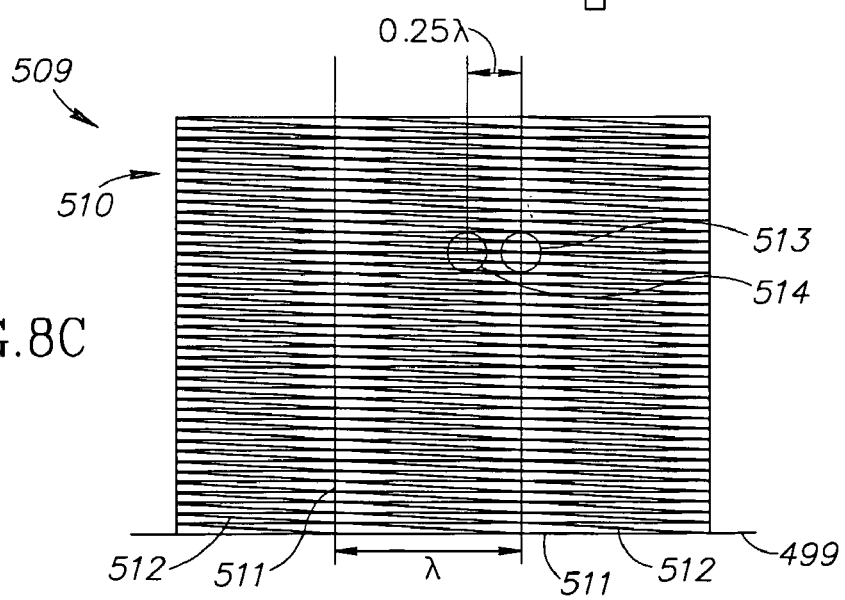
FIG. 8C schematically shows a moiré encoder comprising a moiré pattern generated by periodic patterns shown in FIGS. 8A and 8C, in accordance with prior art.

FIG. 8C schematically shows a moiré encoder 509 comprising a moiré pattern 510 having bright and dark fringes 511 and 512 respectively and a period wavelength $\lambda(\sim D/\sin\theta)$ that is generated by gratings 501 and 502 and a pair of quadrature photodetectors 513 and 514 for sensing changes in the moiré pattern that indicate translation of moveable grating 502. Translation of moveable grating 502 in a direction perpendicular to its grating lines 504 in a direction indicated by block arrow 505 causes bright and dark gratings 511 and 512 to translate to the right. Photodetectors 513 and 514 are separated by a distance 0.25λ along a direction perpendicular to bright and dark fringes 511 and 512.

In order to relax accuracy with which quadrature detectors are positioned and maintained in prior art moiré encoders, quadrature detection in accordance with an embodiment of the invention is provided by providing a moveable or a stationary periodic pattern, hereinafter a "phase shift pattern", that has a region spatially shifted by a quarter of a period relative to another region of the pattern. The phase shift pattern, when used with a non-phase shifted periodic pattern to generate a moiré pattern of fringes, generates a moiré pattern having a region of fringes phase shifted by 90° relative to other regions of the moiré pattern. A moiré encoder in accordance with an embodiment of the invention comprises at least one photodetector that generates signals responsive to motion of the fringes in the phase shifted region of the moiré pattern and at least one photodetector that generates signals responsive to motion of fringes in a non-phase shifted region of the moiré pattern. Because of the 90° phase shift in the moiré pattern fringes, signals generated by the two photodetectors are out of phase by 90° and provide quadrature signals suitable for use in determining directions of motion of an object to which one of the periodic patterns used to generate the moiré pattern is attached. As discussed below, providing a phase shifted moiré pattern, in accordance with an embodiment of the invention, in general relaxes tolerances in the accuracy with which photodetectors in the encoder are positioned and reduces sensitivity of the encoder signals to changes in the moiré angle between the periodic patterns that generate the moiré pattern.

Figure 9A:
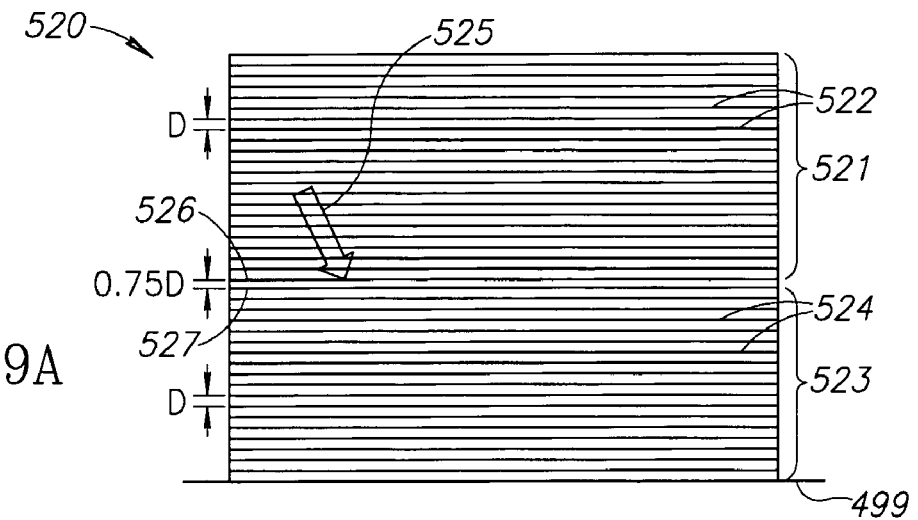
FIGS. 9A and 9B schematically show periodic patterns used to generate a moiré pattern of fringes in a moiré encoder, in accordance with an embodiment of the present invention.

By way of example, it is assumed that the stationary and moveable patterns used to generate a phase shifted moiré pattern, in accordance with an embodiment of the invention, are each gratings comprising parallel lines having a same period, i.e. separated by a same distance, and that the moveable grating is a phase shift grating, that comprises a region shifted by a quarter period. It is noted that forming a phase shift line grating, for example by printing or etching, with a region accurately phase shifted by a desired amount to an adjacent region of the grating is relatively easy using any of many and various techniques known in the art. The inclusion of a quarter period phase shift in FIG. 9A schematically shows a stationary phase shift line grating 520 useable optionally with moveable grating 502, shown in FIG. 8B, and again in FIG. 9B for convenience, to generate a moiré pattern for use in a moiré encoder, in accordance with an embodiment of the invention. Phase grating 520 is similar to grating 503 shown in FIG. 8A except that it comprises two portions, an upper portion indicated by a bracket 521 and comprising lines 522 and a lower portion indicated by a bracket 523 and comprising lines 524. (Numeral 521 and 522 are used to designate the upper and lower portions of grating 520 as well as the brackets that indicate the portions.) Lines 522 and lines 524 are optionally spaced apart by a same distance D. However, lower portion 523 is spatially shifted by quarter of a period relative to upper portion 521. The shift is provided by shifting lower potion 523 optionally towards upper portion 521 (or shifting upper portion 521 downwards) by a distance equal to 0.25 D along a region indicated by block arrows 525 so that a bottom line 526 of upper portion 521 is separated by a distance 0.75 D from an upper line 527 of bottom portion 523.

Figure 9B:
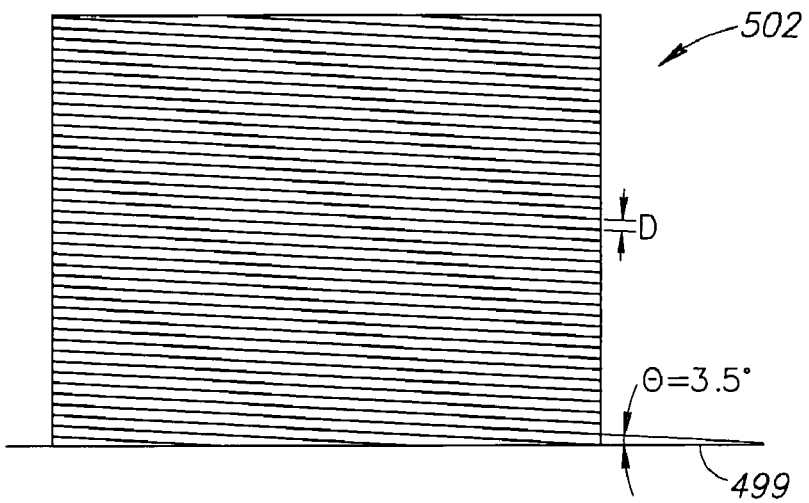
Figure 9C:
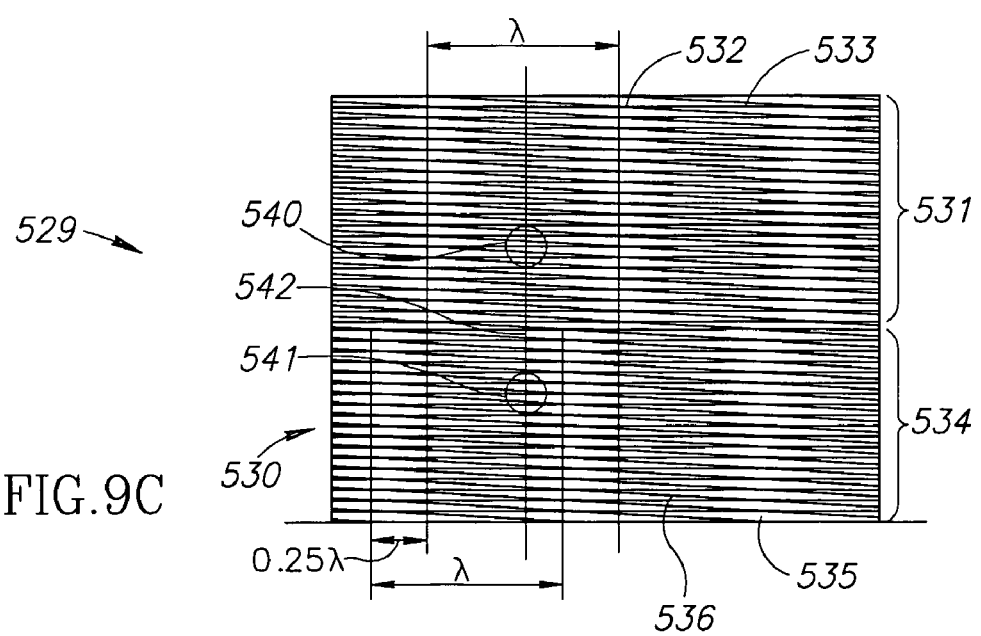
FIG. 9C schematically shows a moiré encoder comprising a moiré pattern generated by periodic patterns shown in FIGS. 9A and 9C, in accordance with the present invention.

FIG. 9C schematically shows a moiré encoder 529 comprising a moiré pattern 530 of fringes generated by stationary phase shift line grating 520 and moveable line grating 502 and photodetectors 540 and 541, in accordance with an embodiment of the invention. Moiré pattern 530 comprises an upper region indicated by a bracket 531 having bright and dark fringes 532 and 533 respectively and a lower region 534 comprising bright and dark fringes 535 and 536 respectively. "Upper" fringes 532 and 533 have a period λ and lower fringes 535 and 536 have a same period λ. However, because of the quarter period shift between upper and lower portions 521 and 523 in phase shift grating 520, lower moiré fringes 535 and 536 are shifted by a quarter period relative to upper moiré fringes 532 and 533.

Quadrature photodetectors 540 and 541 are positioned, in accordance with an embodiment of the invention, so that a line 542 between them is substantially parallel to fringes 532, 533, 535 and 536 and the detectors are filtered respectively by upper and lower portions 521 and 523 of phase shift grating 520 (FIG. 9A). As long as line 542 is substantially parallel to fringes 532 and 535 first and second detectors 540 and 542 provide quadrature signals characterized by a substantially 90° phase shift relative to each other.

It is noted that the relative "quadrature" phase, which is nominally 90°, between signals generated by detectors 540 and 541 in accordance with an embodiment of the invention, is generally less sensitive to a change in the moiré angle between grating 520 and grating 502 than is the relative phase between signals generated by prior art detectors 513 and 514. For example, a change in moiré angle θ equal to Δθ generates a percent change equal to about 100Δθ/θ in relative phase "φ" between signals generated by prior art quadrature photodetectors 513 and 514 (FIG. 8C). On the other hand, for moiré encoder && (FIG. 9C), in accordance with an embodiment of the invention, the same change Δθ in moiré angle θ generates a percent change in φ approximately equal to 100(Δθ/90°)(L/2λ) for signals provided by detectors 540 and 541. In the expression for the percent change L is a distance between 540 and 541 and λ is the wavelength of moiré pattern 530. Since 90°>>θ, the percent change in φ in accordance with the invention is substantially less than that encountered in prior art. In addition, sensitivity to change in moiré angle θ can be further decreased by positioning detectors 540 and 541 relatively close so that the factor (L/2λ) is less than 1. Whereas a rotation of line 542 by an angle Δα away from being parallel to moiré fringes 532 and 533 will also generate a change in relative signal phase φ, the change is relatively small and is estimated as equal to about 100(Δα/90°)(L/λ).

Figure 10A:
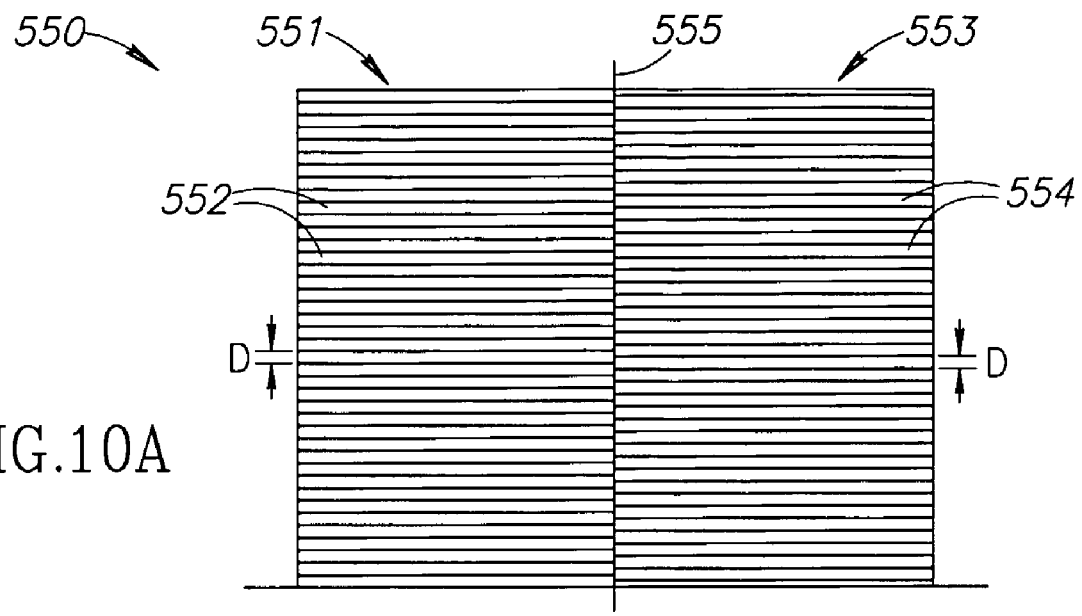
FIGS. 10A and 10B respectively show another schematic periodic pattern used to generate a moiré pattern and a moiré encoder comprising a moiré pattern generated by the periodic pattern in accordance with an embodiment of the invention.
Figure 10B:
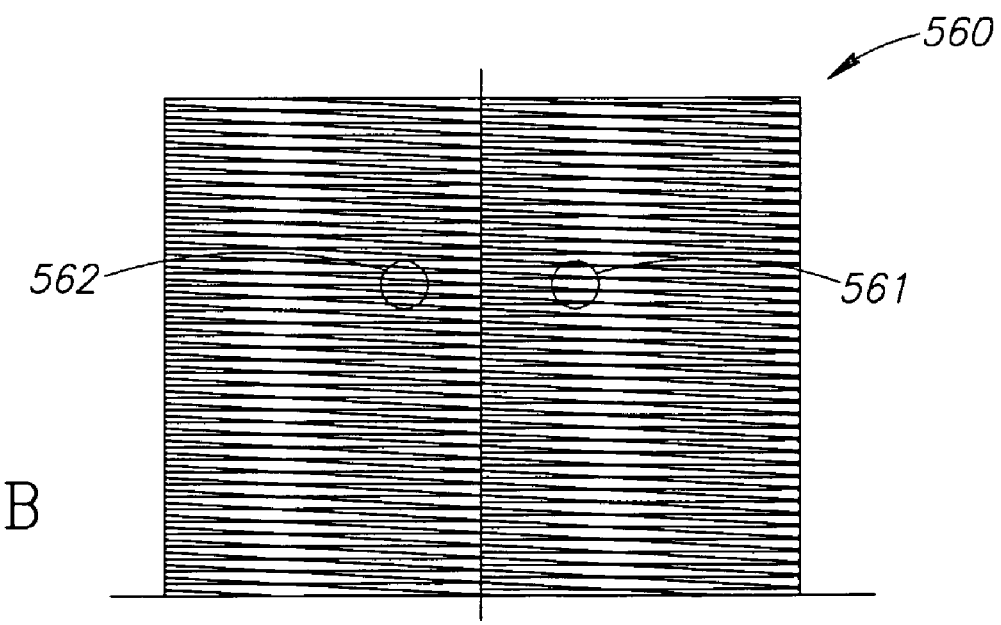

FIG. 10A schematically shows another phase shift grating 550 in accordance with an embodiment of the invention. Phase shift grating 550 comprises a left hand portion 551 comprising grating lines 552 and a right hand portion indicated by a bracket 553 comprising grating lines 554. Grating lines 554 are shifted by a quarter period relative to grating lines 552 along a line 555 perpendicular to the grating lines. FIG. 10B schematically shows a moiré pattern 560 generated by phase shift grating 550 and stationary grating 502 (FIGS. 8B and 9B). Photodetectors 561 and 562 are positioned, in accordance with an embodiment of the invention on opposite sides of line 555 so that the photodetectors are equidistant from the line and a line 556 joining the detectors is substantially perpendicular to line 555. Because of the quarter period shift in lines 552 relative to lines 554, detectors 561 and 562 generate quadrature signal having a relative phase of 90°. It is noted that photodetectors 560 and 561 may be translated together parallel to line 555 without affecting the relative phase of their signals. As in the case of moiré pattern 530 and detectors 540 and 541, detectors 561 and 562 when sensing moiré pattern 560 provide signals having a relative phase that is relatively insensitive to changes in moiré angle θ between phase shift grating 550 and grating 502.

It is noted that whereas in the above exemplary embodiments of moiré patterns a phase shift grating was used as a stationary grating and a "conventional" grating used as a moving grating, in some embodiments of the invention a phase shift grating may be used as a moving grating while a conventional grating is used as a stationary grating.

In the description and claims of the present application, each of the verbs, "comprise" "include" and "have", and conjugates thereof, are used to indicate that the object or objects of the verb are not necessarily a complete listing of members, components, elements or parts of the subject or subjects of the verb.

The present invention has been described using detailed descriptions of embodiments thereof that are provided by way of example and are not intended to limit the scope of the invention. The described embodiments comprise different features, not all of which are required in all embodiments of the invention. Some embodiments of the present invention utilize only some of the features or possible combinations of the features. Variations of embodiments of the present invention that are described and embodiments of the present invention comprising different combinations of features noted in the described embodiments will occur to persons of the art. The scope of the invention is limited only by the following claims.

The invention claimed is:

1. A transport system for moving and positioning an object comprising:
    a tube having an axis of rotation and formed with threads on at least a portion of its inside surface;
    at least one first platform positioned inside the tube to which the object is mountable having threads that mesh with the threads of the tube;
    at least one linear guide along which the at least one platform moves freely that prevents rotation of the at least one platform when the tube rotates about its axis of rotation;
    and at least one second platform positioned inside the tube that does not comprise threads that mesh with threads of the tube;
    and a piezoelectric motor controllable to rotate the tube and thereby selectively translate the at least one platform in either direction along the tube's axis of rotation;
    wherein motion of a first platform moves a second platform between different positions along the tube's axis of rotation.

2. A transport system according to claim 1 further comprising a latch operable to secure the second platform at least one predetermined position along the axis of the tube.

3. A transport system according to claim 2 wherein the latch comprises at least one elastic catch and at least one matching notch formed in a surface of transport system that cooperate to secure the second platform at the at least one predetermined position.

4. A transport system according to claim 3 wherein the second platform comprises a catch of the at least one elastic catch.

5. A transport system according to claim 3 wherein a notch of the at least one notch is formed in the other platform.

6. A transport system according to claim 3 wherein the at least one linear guide comprises an elastic catch of the at least one catch.

7. A transport system according to claim 3 wherein a notch of the at least one notch is formed in the at least one linear guide.

8. A transport system according to claim 2 wherein the at least one predetermined position comprises a plurality of positions.

9. An optical system comprising: a transport system according to claim 1; at least one optical component mounted to a platform of the transport system; and a controller that controls the transport system to move and position the platform and thereby the optical component.

10. An optical system according to claim 9 wherein the optical component comprises a lens.

11. An optical system according to claim 10 wherein the lens is a component of a zoom lens system.

12. A camera comprising an optical system according to claim 9.

13. A cellular phone comprising a camera according to claim 12.

14. A transport system for moving and positioning an object comprising:
    a platform to which the object is mountable;
    at least one piezoelectric motor mounted to the platform having a coupling surface for transmitting kinetic energy from the motor to a moveable body;
    at least one drive rail;
    at least one guide rail parallel to the drive rail along which the platform moves substantially freely; and
    a resilient body that presses the coupling surface of each piezoelectric motor to contact a drive rail of the at least one drive rail and generates torque that urges the platform to each of the at least one guide rail;
    wherein the piezoelectric motor is controllable to apply force to the drive rail to selectively translate the platform in either direction along the drive rail.

15. A transport system according to claim 14 wherein the at least one drive rail comprises a plurality of parallel drive rails.

16. A transport system according to claim 15 wherein a platform of the at least one platform has a different piezoelectric motor mounted thereto for each of the drive rails.

17. A transport system according to claim 14 wherein the resilient body is formed as an integral part of the platform.

18. A transport system according to claim 17 wherein the integral part of the platform is connected to the rest of the platform by a relatively thin resilient neck.

19. A transport system according to claim 18 wherein the integral part and the resilient neck are defined by a slot formed in the platform.

20. A transport system according to claim 14 wherein the platform comprises at least one bearing having a component that rolls along the at least one guide rail.

21. An optical system comprising: a transport system according to claim 14; at least one optical component mounted to a platform of the transport system; and a controller that controls the transport system to move and position the platform and thereby the optical component.

22. A camera comprising an optical system according to claim 21.

23. A cellular phone comprising a camera according to claim 22.

24. A transport system for positioning an object comprising:
    at least one platform to which the object is mountable;
    at least one support structure having a deformable shape coupled to the platform; and
    at least one piezoelectric motor operable to deform the at least one support structure;
    wherein the at least one piezoelectric motor deforms the shape of the support structure from a first shape to a second shape and maintains the deformation of the second shape to move the platform from a first position to a second position.

25. A transport system according to claim 24 wherein the support structure has the shape of a parallelogram.

26. A transport system according to claim 25 wherein the piezoelectric motor changes the height of the parallelogram to change the shape of the support structure.

27. A transport system according to claim 24 wherein the system with the exception of the at least one piezoelectric motor is formed as a single integral piece.

28. A transport system for moving and positioning an object comprising:
   a platform to which the object is mountable;
   a piezoelectric motor mounted to the platform having a coupling surface for transmitting kinetic energy from the motor to a moveable body;
   a drive rail having a surface that contacts the coupling surface;
   a guide rail parallel to the drive rail along which the platform moves substantially freely; and
   a leaf spring mounted to the platform and configured to apply forces to the motor that resiliently urge the coupling surface in a direction having a component parallel to and perpendicular to the surface of the drive rail;
   wherein the piezoelectric motor is controllable to apply force to the drive rail surface to selectively translate the platform in either direction along the drive rail.

29. A transport system according to claim 28 wherein the leaf spring comprises a tine that extends from an edge of the leaf spring to apply the force that urges the coupling surface parallel to the guide rail surface.

30. An optical system comprising: a transport system according to claim 28; at least one optical component mounted to a platform of the transport system; and a controller that controls the transport system to move and position the platform and thereby the optical component.

* * * * *